United States Patent [19]

Matsutani

[11] Patent Number: 5,418,613
[45] Date of Patent: May 23, 1995

[54] METHOD AND APPARATUS FOR DETECTING THE POSITION OF A SUBSTRATE HAVING FIRST AND SECOND PATTERNS OF DIFFERENT SIZES

[75] Inventor: Shigeki Matsutani, Sagamihara, Japan

[73] Assignee: Canon Kabushiki Kaisha, Tokyo, Japan

[21] Appl. No.: 858,881

[22] Filed: Mar. 27, 1992

Related U.S. Application Data

[63] Continuation-in-part of Ser. No. 794,959, Nov. 20, 1991, abandoned.

[30] Foreign Application Priority Data

| Nov. 20, 1990 | [JP] | Japan | 2-316845 |
| Mar. 29, 1991 | [JP] | Japan | 3-093620 |
| Mar. 29, 1991 | [JP] | Japan | 3-093621 |
| Mar. 29, 1991 | [JP] | Japan | 3-093622 |

[51] Int. Cl.⁶ .................................. G01B 11/00
[52] U.S. Cl. .................................. 356/401; 250/548
[58] Field of Search ............... 356/375, 399, 400, 401; 250/548; 382/8

[56] References Cited

U.S. PATENT DOCUMENTS

| 4,371,264 | 2/1983 | Lacombat et al. | 356/356 |
| 4,814,829 | 3/1989 | Kosugi et al. | |
| 4,834,540 | 5/1989 | Totsuka et al. | |
| 4,886,974 | 12/1989 | Ina | |
| 4,906,852 | 3/1990 | Nakata et al. | 250/548 |
| 4,955,062 | 9/1990 | Terui | |
| 4,962,318 | 10/1990 | Nishi | 250/548 |
| 4,971,444 | 11/1990 | Kato | 356/375 |
| 5,028,797 | 7/1991 | Abe et al. | |

FOREIGN PATENT DOCUMENTS

| 62-232504 | 10/1987 | Japan . |
| 63-100719 | 5/1988 | Japan . |
| 2-206706 | 8/1990 | Japan . |

OTHER PUBLICATIONS

"Nanometer Position Detecting Method Based on Holograph Method", Yamashita et al., 1990 Autumn, The Japanese Society of Applied Physics, Abstract, 27-Z-G-16.

"Optical Heterodyne Alignment For Projection Exposure Apparatus", Magome et al, 1989 Autumn, The Japanese Society of Applied Physics, Abstract, 29a--L-2.

"Fundamentals of topographic substrate leveling", L. E. Stillwagon et al, SPIE vol. 920, Advances in Resist Technology and Processing V (1988), pp. 312-320.

*Primary Examiner*—F. L. Evans
*Attorney, Agent, or Firm*—Fitzpatrick, Cella, Harper & Scinto

[57] ABSTRACT

A method of detecting a position of the substrate with respect to a particular direction, wherein the substrate has first and second patterns of different sizes in the particular direction and has a surface layer formed thereon includes the steps of detecting the first and second patterns to produce first and second data related to the position of the substrate; and predicting, by using the first and second data and the sizes of the first and second patterns in the particular direction, the position of the substrate as determined when the pattern size in the particular direction is sufficiently small.

10 Claims, 36 Drawing Sheets

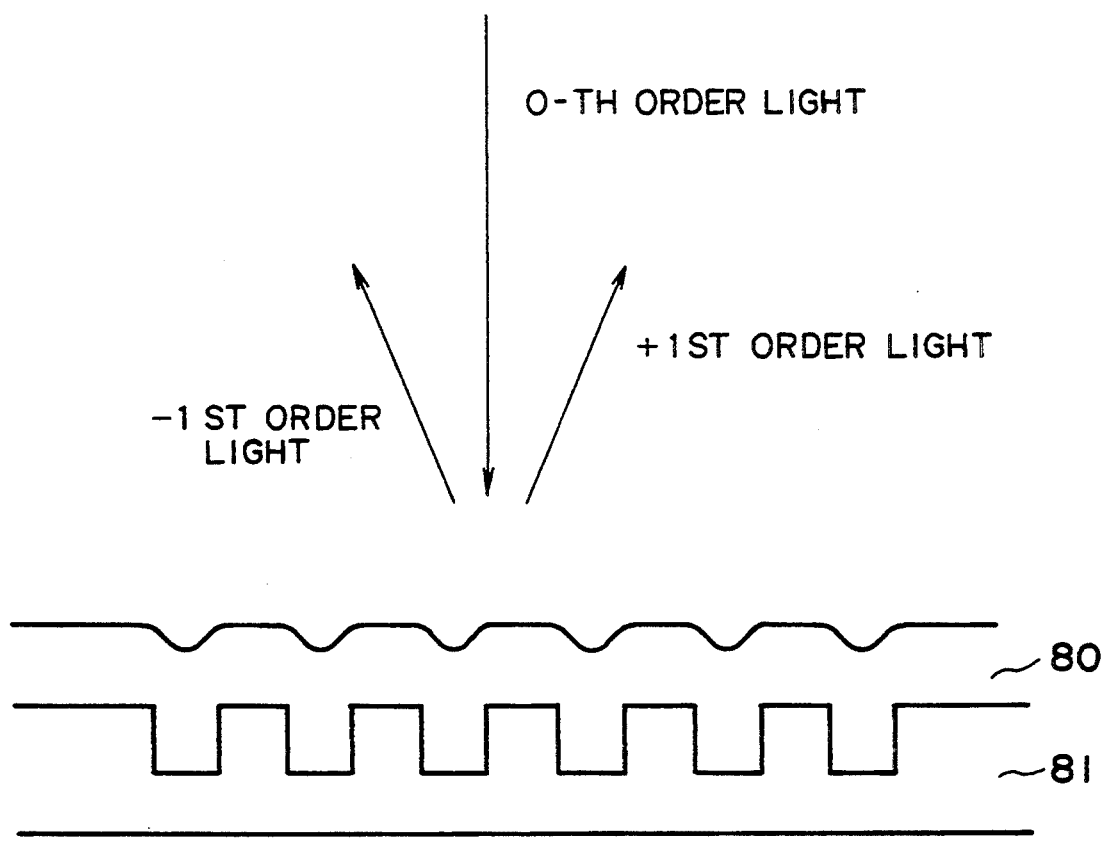
F I G. 15

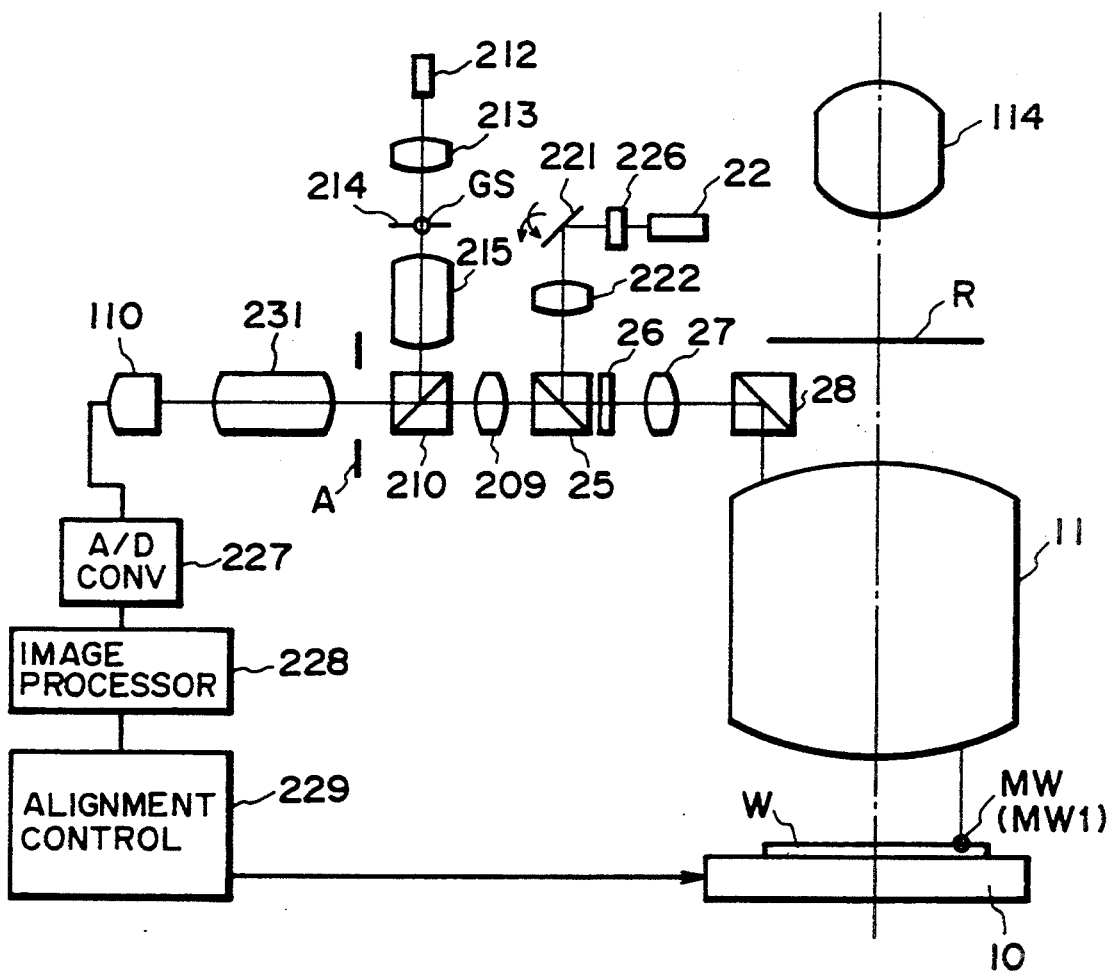
F I G. 26

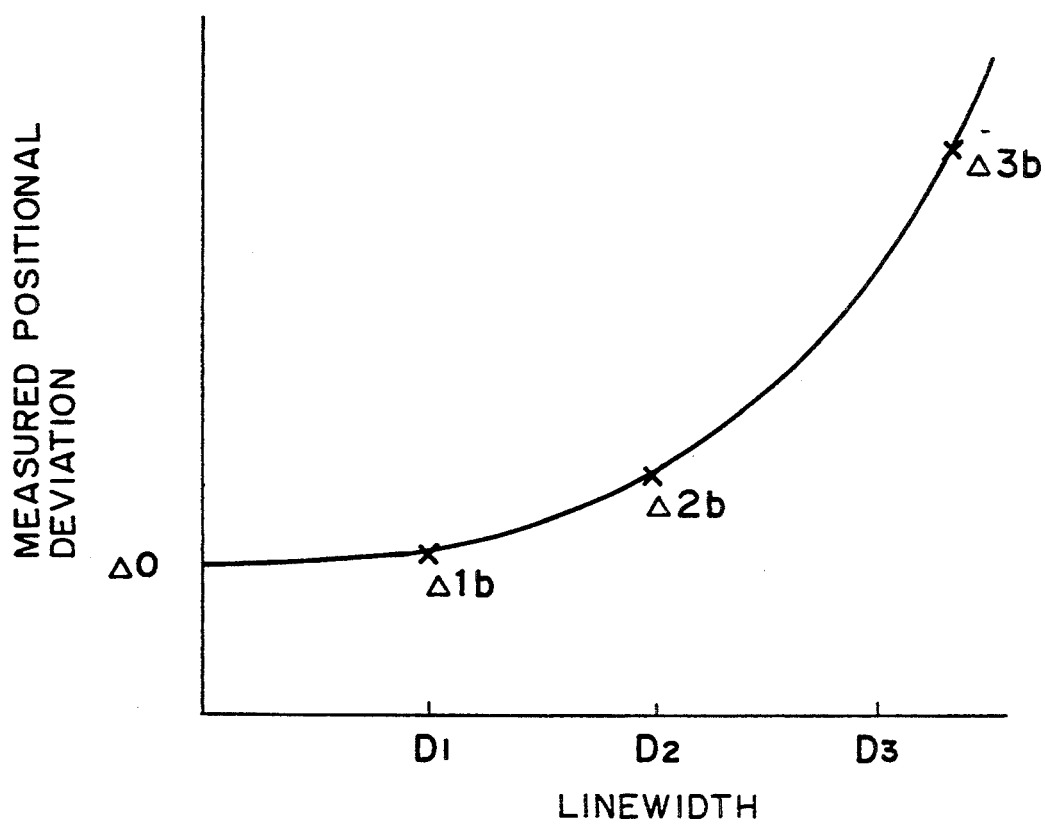
F I G. 33

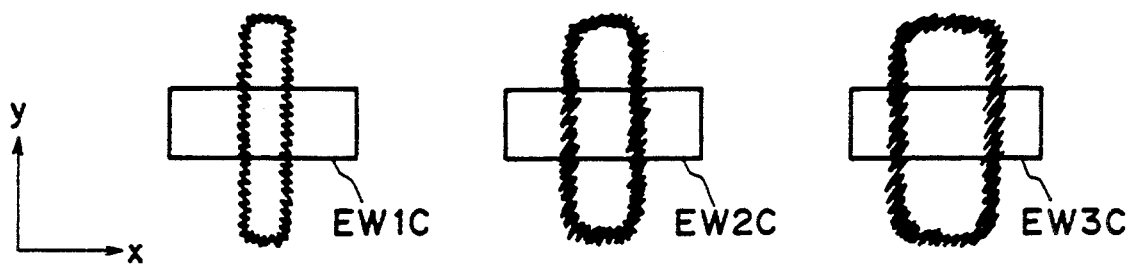
FIG. 41(A)  FIG. 41(B)  FIG. 41(C)
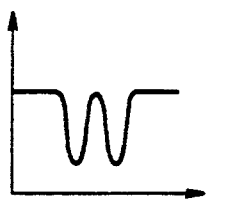 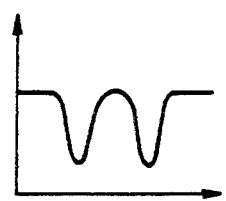 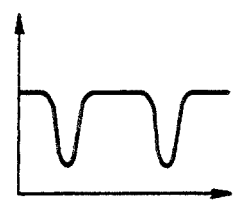
FIG. 41(D)  FIG. 41(E)  FIG. 41(F)
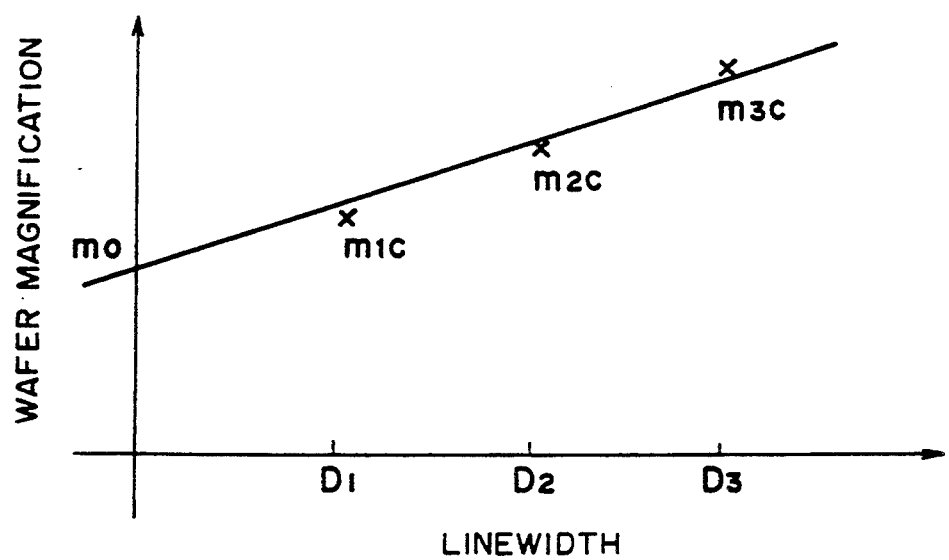
FIG. 42

METHOD AND APPARATUS FOR DETECTING THE POSITION OF A SUBSTRATE HAVING FIRST AND SECOND PATTERNS OF DIFFERENT SIZES

This is a continuation-in-part application of U.S. Ser. No. 794,959 filed Nov. 20, 1991, now abandoned.

FIELD OF THE INVENTION AND RELATED ART

This invention relates to a position detecting method and, more particularly, to a position detecting method for detecting the position of a substrate by using an alignment mark formed on the substrate. As an example, the position detecting method of the present invention is particularly suitably usable in an exposure apparatus or a semiconductor device manufacturing process wherein high precision detection of the position of a substrate such as a wafer is desired.

It is well known in the art to which the present invention pertains that, before exposing a resist-coated wafer to print a circuit pattern on the resist of the wafer, an image of an alignment mark or marks of the wafer is observed to obtain information about the position of the wafer and, based on this positional information, the position of the wafer is adjusted.

Also, it is well known that an image of an alignment mark of a wafer (i.e. wafer mark) when observed may include distortion resulting from the effect of non-uniformness of a resist coating thereon or of asymmetry of three-dimensional structure of the alignment mark. This causes a measurement error (which may be called "misestimation") in the detection of the position of that alignment mark, which directly leads to degradation of the wafer alignment precision.

Particularly, for a wafer in a semiconductor device manufacturing process having a metal alloy material deposited thereon by sputtering or the like and having a resist coated thereon, such misestimation attributable to the wavy surface shape particularly at the portion around the alignment mark, caused by non-uniform coating of resist, provides a non-negligible effect.

As regards the cause of misestimation by a resist layer in a process of metal alloy deposition, since the metal alloy has a high reflectivity, interference of light due to reflection by an upper surface of the resist and the surface of the substrate is not a major factor. Rather, a geometo-optical phenomenon due to non-uniform coating of resist has a major effect.

FIG. 1 is a light path view illustrating this phenomenon. The upper part (A) of FIG. 1 shows the section in the neighborhood of an alignment mark of a wafer.

Denoted in the drawing at 81 is the wafer, denoted at 80 is a resist, and denoted at 83 is an air layer. Numeral 82 denotes paths of light rays which are portions of illumination light. Numeral 85 denotes a groove structure of the alignment mark. Due to local changes (wavy shape) of the resist surface 85a, the direction of refraction of the light ray 82 changes largely.

Where the surface 81a of the wafer substrate has a large reflectivity, the interference effect of the reflection light from the resist surface 80a and the reflection light from the wafer surface 81a would be sufficiently smaller than the geometo-optic effect thereof.

The lower part (B) of FIG. 1 depicts a light intensity distribution of an image of the alignment mark shown in the upper part (A) of FIG. 1. It is seen that, with the local changes of the resist surface 80a, the image of the alignment mark as observed is laterally shifted. This cannot be obviated by using white illumination light or suitable wavelength of illumination light which is an effective measure for reducing the interference effect.

SUMMARY OF THE INVENTION

It is accordingly a primary object of the present invention to avoid "misestimation" due to such a geometo-optic effect as described above.

It is another object of the present invention to provide a position detecting method by which the position of a substrate such as a wafer, for example, can be detected with enhanced precision.

In accordance with an aspect of the present invention, to achieve these objects, there is provided a method of detecting a position of the substrate with respect to a particular direction, wherein the substrate has first and second patterns of different sizes in the particular direction and has a surface layer formed thereon, the method comprising the steps of: detecting the first and second patterns to produce first and second data related to the position of the substrate; and predicting, by using the first and second data and the sizes of the first and second patterns in the particular direction, the position of the substrate as determined when the pattern size in the particular direction is sufficiently small.

The prediction may include determining a function $x = x(w)$ wherein w is the size and x is the quantity of data, by using the first and second data and the sizes of the first and second patterns in the particular direction, and determining a data $x(0)$ related to the position of the substrate, by using the function.

In accordance with a second aspect of the present invention, there is provided a semiconductor device manufacturing method wherein a position, in a particular direction, of a wafer having first and second patterns of different sizes in the particular direction and a resist layer formed thereon, is adjusted and then a circuit pattern is printed on the resist layer, the improvements residing in the steps of: detecting the first and second patterns to produce first and second data related to the position of the wafer; predicting, by using the first and second data and the sizes of the first and second patterns in the particular direction, the position of the wafer as determined when the pattern size in the particular direction is sufficiently small; and adjusting the position of the wafer on the basis of the prediction.

The prediction may include determining a function $x = x(w)$ wherein w is the size and x is the quantity of data, by using the first and second data and the sizes of the first and second patterns in the particular direction, and determining a data $x(0)$ related to the position of the wafer, by using the function.

In accordance with a further aspect of the present invention, there is provided an exposure apparatus for exposing a wafer having first and second patterns of different sizes in a particular direction and having a resist layer formed thereon, the apparatus comprising: a movable stage for supporting the wafer; exposing means for irradiating the resist of the wafer with a radiation beam in response to alignment of the wafer with respect to a predetermined position, to print a circuit pattern on the resist of the wafer; a detection optical system for photoelectrically detecting the first and second patterns to produce first and second signals related to them; and control means having a signal processing device for producing, by using the first and second signals and the sizes of the first and second patterns in the particular direction, a third data related to the position of the wafer as determined when the pattern size in the particular direction is sufficiently small, the control means controlling movement of the movable stage on the basis of the third data to complete the alignment of the wafer.

The signal processing device may determine a function x=x(w) wherein w is the size and x is the quantity of data, by using the first and second data and the sizes of the first and second patterns in the particular direction and, by using the function, it may determine a data x(0), as the third data.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 15 is a schematic view for explaining the diffraction pattern caused by a wafer mark.

FIG. 26 is a schematic view of a major portion of the optical arrangement of a further embodiment of the present invention.

FIG. 33 is a schematic view for explaining the correction of misestimation in detecting the center position of the wafer mark, as the wafer mark of FIG. 32 is used.

FIGS. 41(A)-(F) are schematic views of an image of the wafer mark of FIG. 40.

FIG. 42 is a schematic view for explaining the correction of misestimation in detecting the wafer magnification, in accordance with the method shown in FIG. 39.

DESCRIPTION OF THE PREFERRED EMBODIMENTS

It is known that a certain relationship lies between the shape of a wafer mark and the surface waviness of a resist. According to L. E. Stillwagon and R. G. Larson, it is said that the wider the linewidth of a wafer mark is, the worse the flatness of the resist surface is; to the contrary, the narrower the linewidth is, the better the flatness of the resist surface is ("SPIE" Vol. 920, p312–320, 1988).

The flatness P of the resist surface can be defined by the following equation:

$$P = (WD1 - WD2)/WD3$$

where WD1 is the resist thickness at the center of the wafer mark, WD2 is the resist thickness at a position away from the wafer mark, and WD3 is the level difference of the stepped structure of the wafer mark.

From this, it is seen that, at an extreme where the linewidth of the wafer mark becomes equal to zero, the flatness P of the resist surface is maximum.

Thus, the narrower the linewidth is, the higher the flatness of the resist surface is, that is, the smaller the local surface waviness around the wafer mark is. In other words, it is assured to obtain an alignment signal with less misestimation.

Figure 1A:
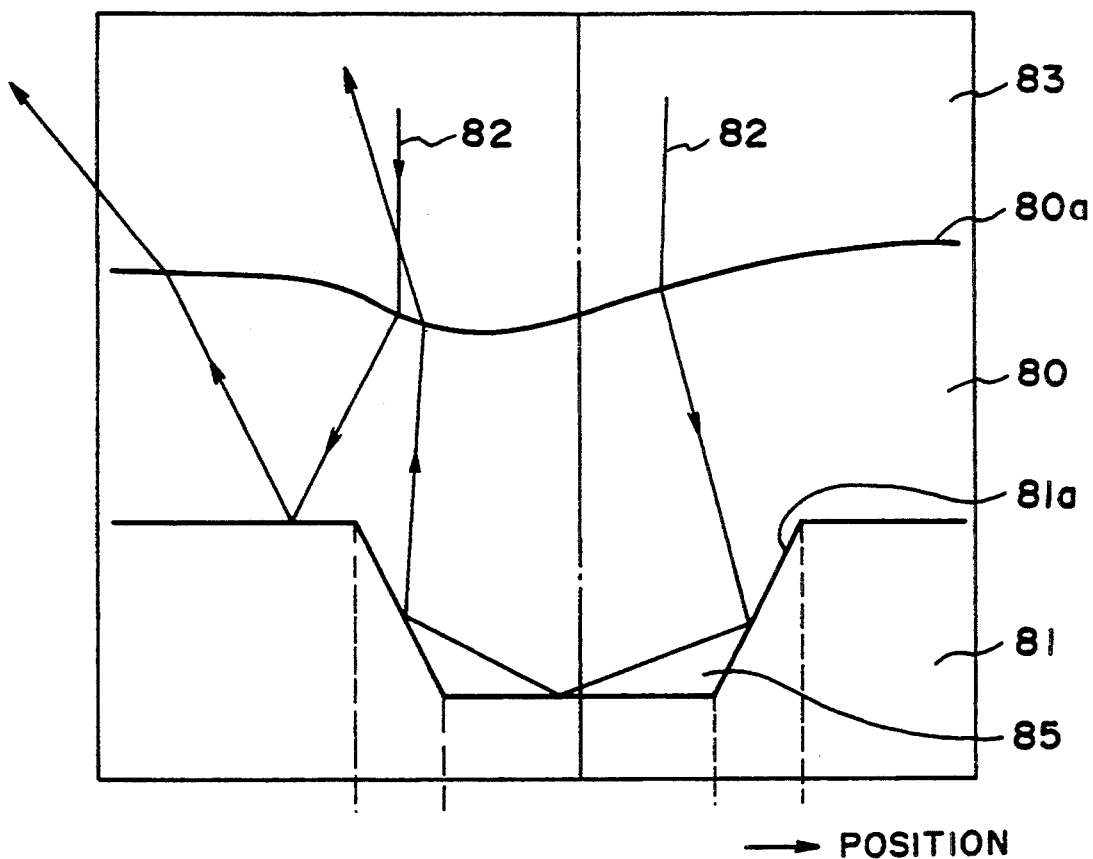
FIGS. 1(A) and (B) are schematic views for explaining misestimation resulting from a geometo-optic effect due to waviness of the surface of a resist.
Figure 1B:
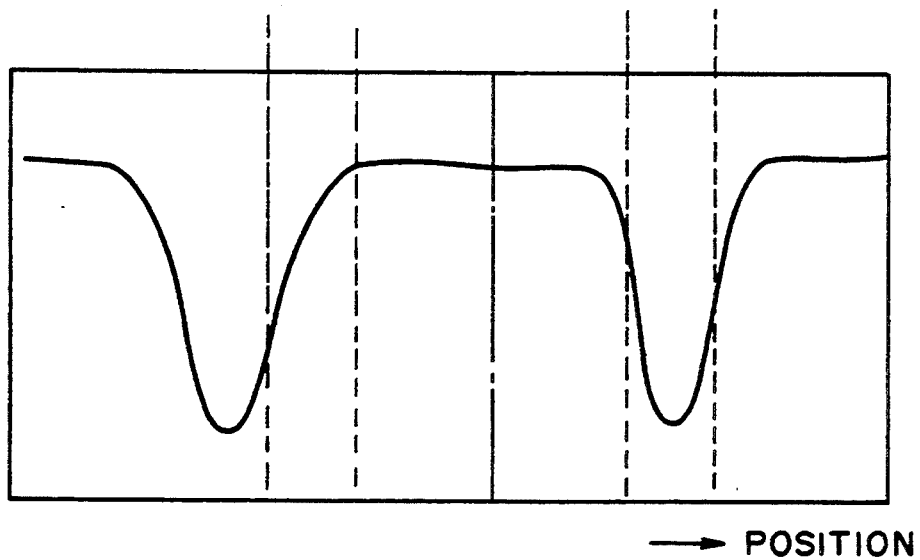
Figure 2A:
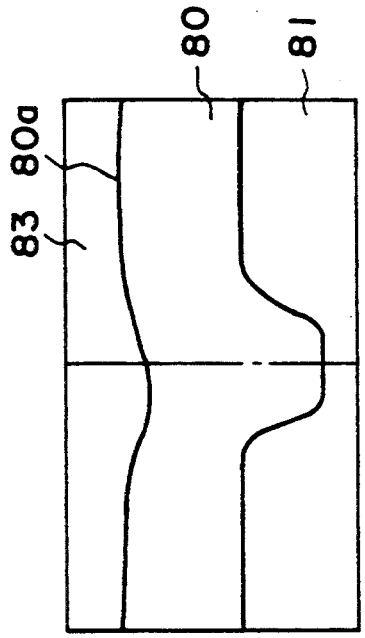
FIGS. 2(A)-(D) are schematic views for explaining the relationship between the line width of an alignment mark and the misestimation resulting from its geometo-optic effect.
Figure 2C:
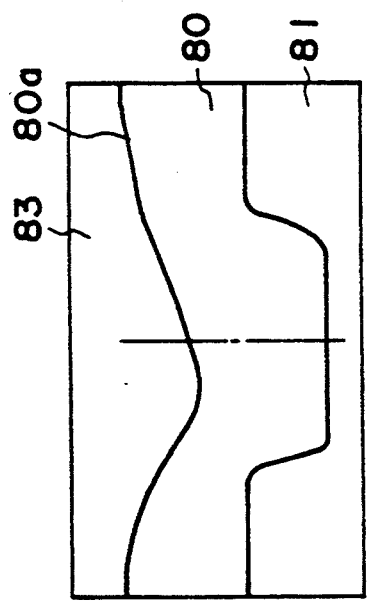
Figure 2B:
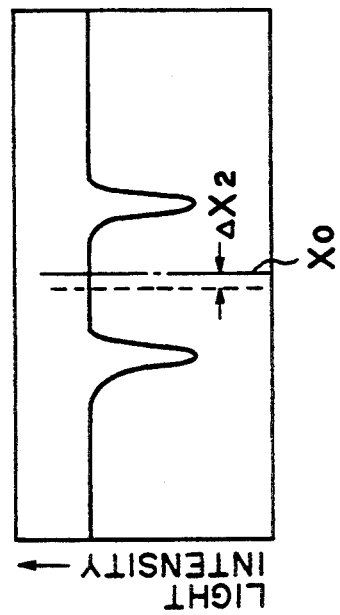

FIGS. 2(A)–2(D) are drawings for explaining changes in light intensity distribution of observation light corresponding to the linewidth of a wafer mark. Where the linewidth is large such as shown in FIG. 2(A), the flatness of the resist surface 80a is worse and, as seen in FIG. 2(B), there occurs a large misestimation $\Delta \times 1$ to the center position x0.

Figure 2D:
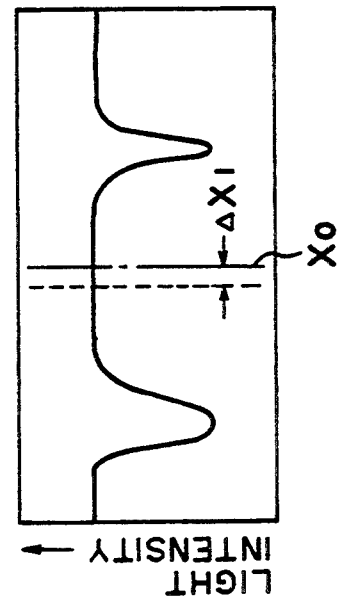

If, on the other hand, the linewidth is narrow such as shown in FIG. 2(C), the flatness of the resist surface 80a is better and, as seen in FIG. 2(D), there occurs only a small misestimation $\Delta \times 2$ to the center position x0, as compared with the FIG. 2(B) case.

A particular note has been paid to this relationship, in the present invention, and it is intended to assure precise detection of the position of a substrate such as a wafer by using this relationship.

Figure 3:
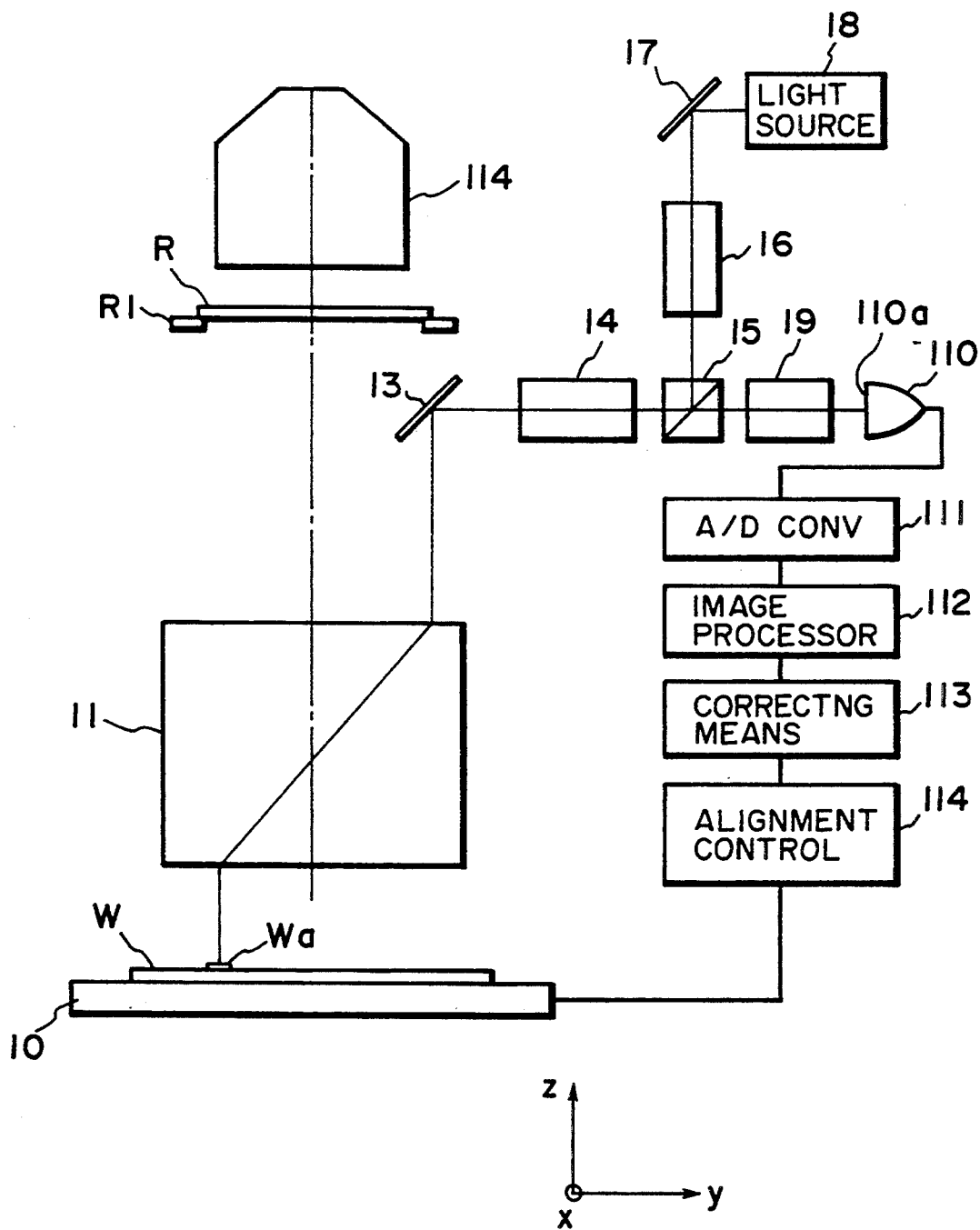
FIG. 3 is a schematic and diagrammatic view of a major portion of an embodiment of the present invention.

FIG. 3 is a schematic and diagrammatic view showing a major portion of an embodiment of the present invention. Denoted at R in the drawing is a reticle having an electronic circuit pattern formed thereon. The reticle R is supported on a reticle stage R1. Denoted at 114 is an illumination system for exposure, and it may comprise an ultra-high voltage Hg lamp, a condenser lens, a shutter and so on, for uniform illumination of the reticle R surface. Denoted at 11 is a projection lens system (exposure optical system) for projecting an image of the pattern of the reticle R onto the surface of a semiconductor wafer W, in a reduced scale (e.g. 1/5–1/10). Denoted at 10 is a movable wafer stage by which the wafer W placed thereon can be moved in X-axis, Y-axis and Z-axis directions.

In the present embodiment, during the exposure operation, by means of those elements described above, the pattern of the reticle R surface is transferred by projection to different shot areas of the wafer W surface.

Here, the wafer W has formed thereon a wafer mark (alignment mark) Wa of relief type, for alignment purpose to be described later. Also, by the prepositioning, the reticle R is positioned with respect to the main stationary portion of the exposure apparatus (e.g. image pickup means 110).

Thus, by detecting the relative position of the wafer W and the image pickup means 110, it is possible to bring the wafer into alignment with the reticle R. Actually, by means of a prealigning means not shown, the positional relationship between the wafer and the image pickup means 110 is detected beforehand, with a precision of the order of microns.

Next, a description will be provided of various components for accomplishing alignment of the wafer with the main stationary portion of the exposure apparatus (e.g. image pickup means 110).

Here, in FIG. 3, the Z axis is laid along the optical axis of the projection lens system 11; the Y axis is laid along a lateral direction as viewed in this drawing; and the X axis is laid along a direction perpendicular to the sheet of the drawing. In the present embodiment, a description will be provided of the alignment operation with regard to the X-axis direction. However, this applies to the alignment operation with regard to the Y-axis direction.

Denoted at 18 is a light source means for emitting light of a wavelength (wavelengths) substantially the same as that of the light for the exposure process. The light from the light source means 18 is reflected by a mirror 17 and then is converged by an illumination optical system 16.

The light from the illumination optical system 16 is reflected by a half mirror 15 and, after passing through (or reflected by) an objective lens 14, a mirror 13 and the projection lens system 11, it illuminates the alignment mark (wafer mark) Wa on the wafer W surface.

Figure 4:
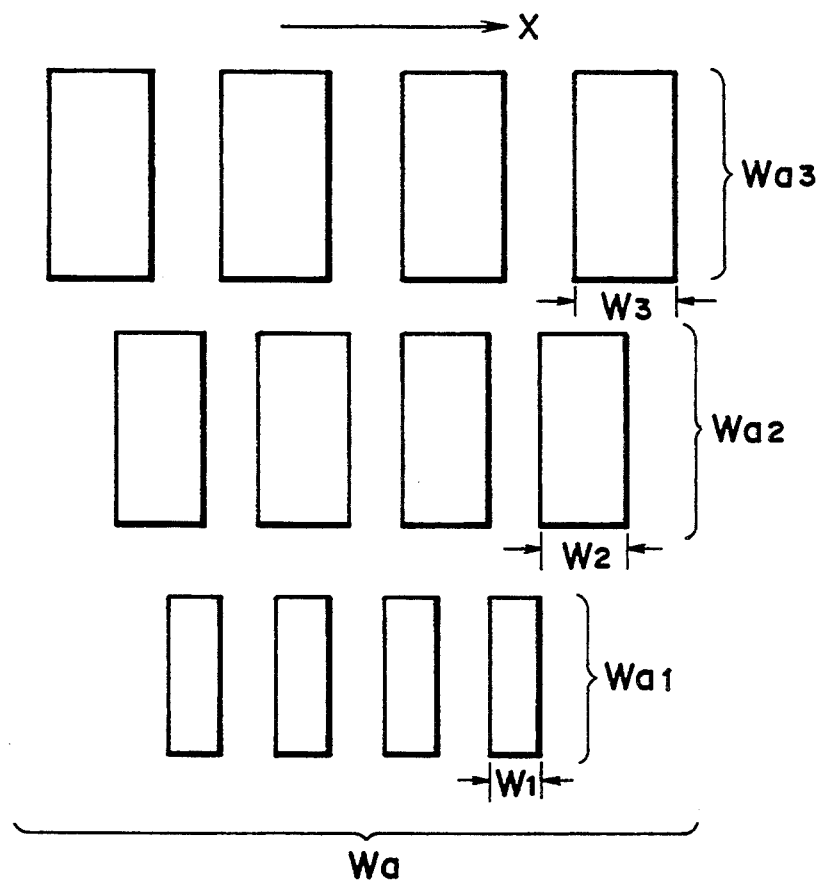
FIG. 4 is an enlarged view schematically showing a wafer mark Wa of FIG. 3.

As best seen in FIG. 4, the wafer mark Wa comprises three types of wafer marks Wa1, Wa2 and Wa3 of three-dimensional shape, having different linewidths (while three types of wafer marks Wa1–Wa3 are shown in the drawing, the number may be modified as desired).

The wafer marks Wa1 (four in this example) each has a linewidth w1, and they are arrayed along the alignment direction (X-axis direction) equidistantly. The wafer marks Wa2 each has a linewidth w2 while the wafer marks Wa3 each has a linewidth w3 and, like the wafer marks Wa1, they are arrayed along the alignment direction equidistantly.

The light reflected by the wafer mark Wa goes through (or is reflected by) the projection lens system 11 and the mirror 13, and it is incident on the objective lens 14. On the path of light from the wafer mark to the objective lens and at a position which is at optically the same distance (from the wafer W) with the reticle R, an aerial image is formed. Then, by means of the objective lens 14, the half mirror 15 and an image pickup lens 19, a wafer mark image Wa' is formed on an image pickup surface 110a of the image pickup means 110.

Figure 5:
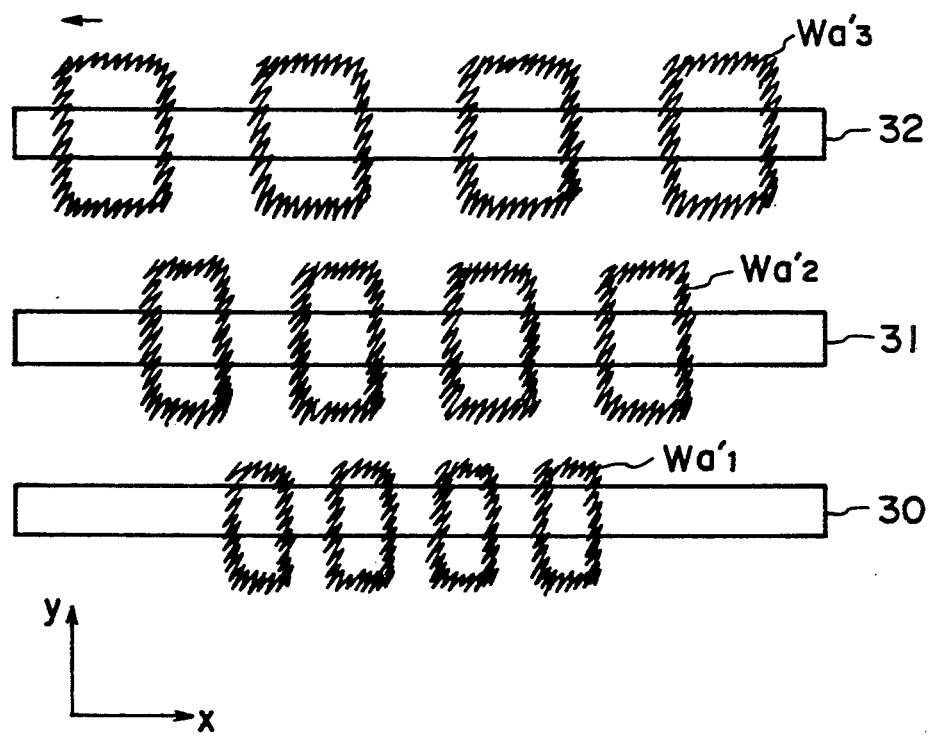
FIG. 5 is a schematic view for explaining an image of a wafer mark on an image pickup means 110 surface of FIG. 3.

FIG. 5 schematically illustrates the wafer mark image Wa' (Wa1'–Wa3') formed on the image pickup means 110. The image pickup means 110 may comprise a photoelectric conversion means such as an ITV or an area image sensor, for example, and it serves to convert an image formed on the image pickup surface 110a into a two-dimensional electric signal.

In this embodiment, in the standard state, the wafer W surface and the reticle R surface are placed in an optically conjugate relationship, while the wafer W surface and the image pickup surface 110a are placed in an optically conjugate relationship.

The wafer mark image Wa' converted by the image pickup means 110 into a two-dimensional electric signal is processed by an analog-to-digital (A/D) converting means 111 (FIG. 3), and it is converted into a two-dimensional discrete electric signal train which corresponds to the addresses, in the X-axis and Y-axis directions, of two-dimensional pixels as determined in accordance with the pixel pitch of the image pickup surface 110a as well as the optical magnification of the image pickup lens 19, the objective lens 14 and the projection lens system 11.

Figure 6:
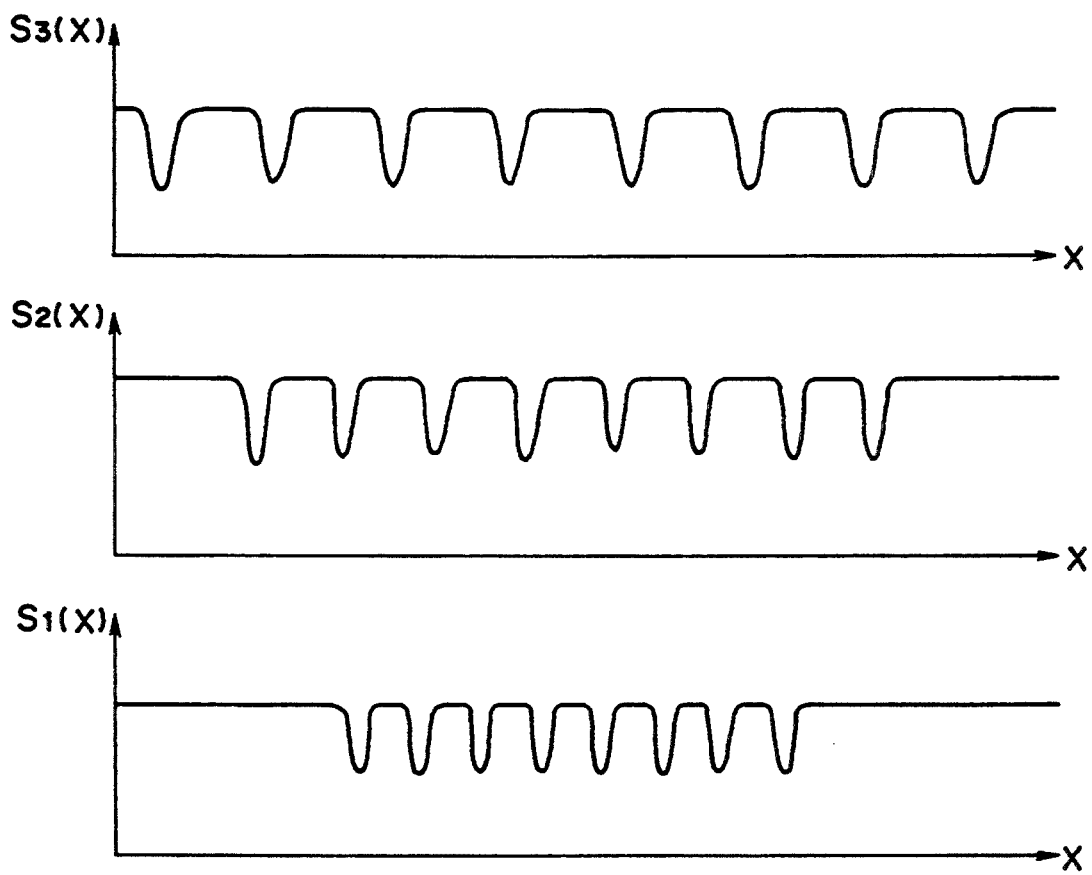
FIG. 6 is a schematic view for explaining light intensity distribution of the wafer mark image on the image pickup means 110 surface of FIG. 3.

Image processing means 112 serves to set two-dimensional windows 30-32 (FIG. 5) of predetermined ranges, including portions of the wafer mark image Wa' and after this, it serves to execute pixel integration in the windows 30-32 (FIG. 5) along the Y-axis direction. Thus, by way of an example, the image processing means 112 produces electrical signal trains $S\mu(x)$ ($\mu=1$, 2, 3) such as shown in FIG. 6, each being discrete with respect to the X-axis direction. The thus obtained integration signal $S(x)$ may be processed in accordance with a one-dimensional pattern matching method such as disclosed in Japanese Laid-Open Patent Application, Laid-Open No. 63-100719.

Figure 7:
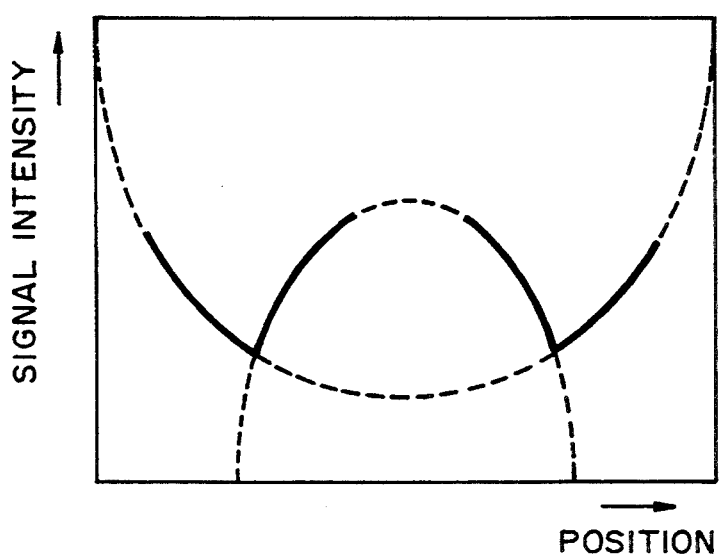
FIG. 7 is an illustration for explaining a template for pattern matching.

FIG. 7 shows curves obtained by approximation with parabola, as a template for the one-dimensional pattern matching to be made in this embodiment. In the drawing, thick lines depict the template. Geometrical pattern matching using such a template is executed to each signal $S\mu(x)$ ($\mu=1, 2, 3$). More specifically, with respect to the signal intensity direction, a least square method is used to effect the fitting of each point of the signal $S(x)$ with the template and, thereafter, on the basis of a difference at that point and the second order term of the parabola of the template, a correlational function for discrimination of the mark center is calculated.

Here, the point having a high degree of correlation is determined as a provisional center position of each wafer mark Wa and, after using a complementing means to the correlational function as determined with regard to a few pixels about the center of each wafer mark to thereby enhance its resolution, signals related to the positions of the wafer marks Wa1-Wa3 are outputted. After this, provisional center positions of the wafer marks, of the same linewidth, constituting each of the wafer marks Wa1-Wa3, are determined in accordance with a statistical processing method (e.g. averaging).

Now, the function related to the linewidth data (w1, w2, w3) of the wafer marks Wa1-Wa3 and the position data (x1, x2, x3) of them, calculated in the alignment device of the present embodiment, will be defined.

Figure 8:
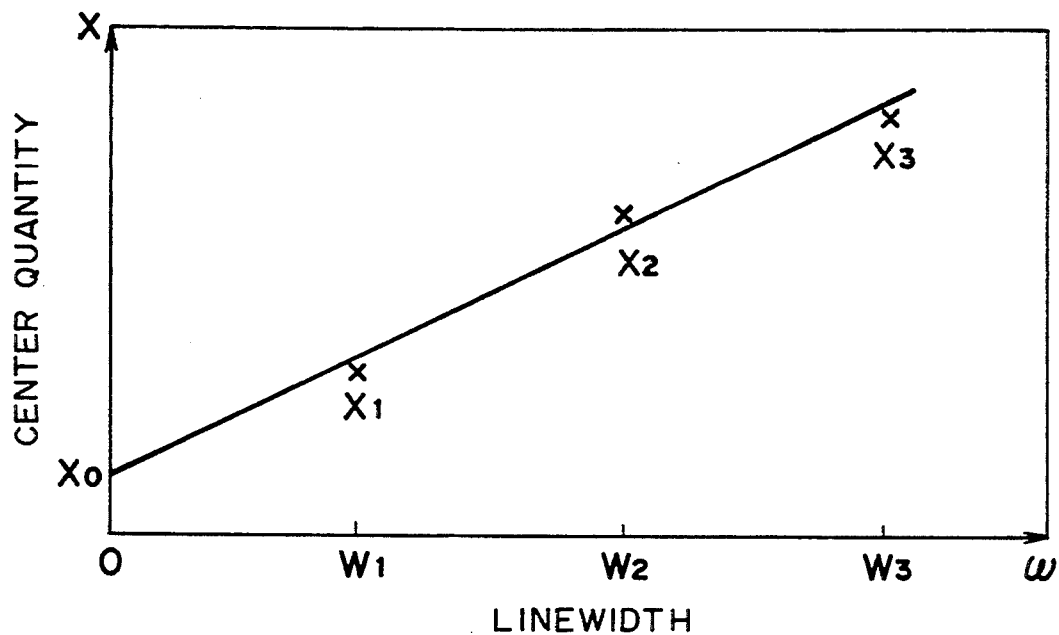
FIG. 8 is an illustration for explaining correction of misestimation in the detection of a center position of a wafer mark.

FIG. 8 is a representation for visually showing this function, and the axis of abscissa corresponds to the linewidth w of the wafer mark while the axis of ordinate corresponds to the information on the calculated provisional center position x of the mark which includes a quantity of misestimation. By using corresponding quantities (x1, w1), (x2, w2) and (x3, w3), a coefficient for a corrective function stored in the alignment device beforehand is determined in accordance with a least square method, for example. Then, by using the determined function $X(w)$, an extreme of zero linewidth is set provisionally, and the value of the center position at that linewidth is selected as the value without misestimation. Thus, it is determined as the center position of the water mark.

In the present embodiment, where the above-described function is a linear function, where the alignment direction is denoted by x, where the linewidth of the wafer mark is denoted by w, and where the coefficients are denoted by $\alpha$ and $\beta$, then $$x = x(w) = \alpha x + \beta$$

and, by using statistical means (e.g. using a least square method), $\alpha$ and $\beta$ are determined, whereby the center position $$x_0 \left( \equiv \lim_{w \to 0} x(w) \right)$$

of the wafer mark, without misestimation, is determined.

In the present embodiment, as the function, a second order or a higher order function may be used.

By using the thus obtained center position $x_0$ of the wafer mark without misestimation and by means of a control means 114 for the wafer mark alignment, the position of the wafer mark is controlled to execute relative alignment of the wafer W with the image pickup means 110, namely, with the reticle R. In the present embodiment, after completion of the relative alignment (alignment without misestimation), the exposure operation is effected.

Figure 10:
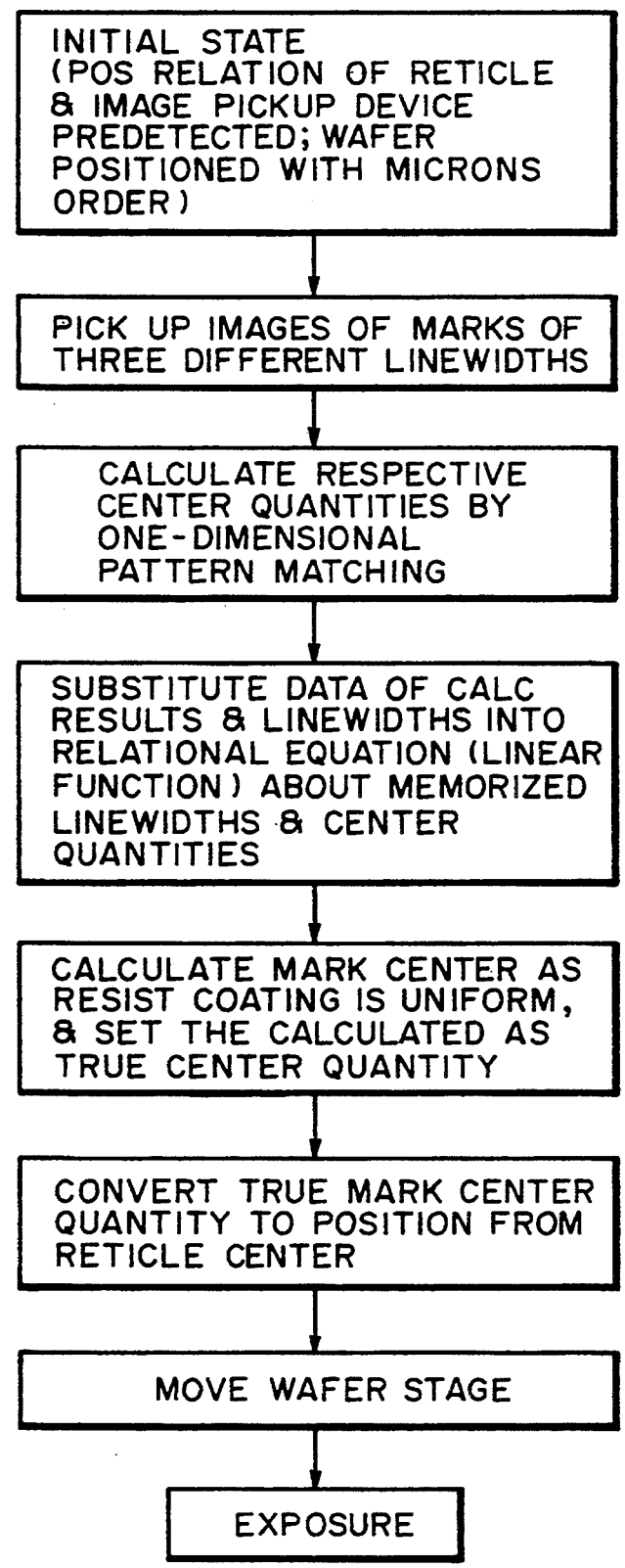
FIG. 10 is a flow chart of alignment operation to be made in the FIG. 3 device.

FIG. 10 is a flow chart of the aligning method according to this embodiment.

Figure 9:
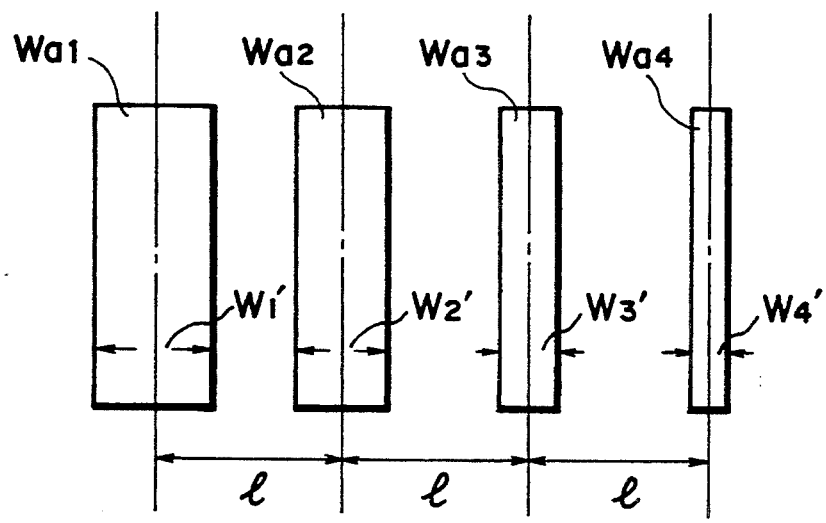
FIG. 9 is an enlarged schematic view of another example of a wafer mark according to present invention.

While the present embodiment uses a wafer mark such as shown in FIG. 4, any type of wafer mark may be used provided that it comprises a combination of mark elements of different linewidths, whose relative position is known. By way of an example, a wafer mark such as shown in FIG. 9, having four wafer marks Wa1-Wa4 of different linewidths w1'-w4' (wherein w1'>w2'>w3'>w4') arrayed at a regular pitch l along the alignment direction, may be used. Also, substantially the same advantageous effects are attainable when these wafer marks Wa1-Wa4 are arrayed in a direction perpendicular to the alignment direction.

In the present embodiment, an image of a wafer mark of a wafer, for alignment purpose, is formed on an image pickup means 110 through an optical system and the thus formed wafer mark image is used. However, as an alternative, the invention is applicable to an alignment device wherein a light receiving means having a pinhole is disposed in place of the image pickup means 110 (FIG. 3); wherein, by using a scanning means, the wafer mark Wa surface is scanned with the light from the light source means 18; and wherein, by using a signal related to light intensity changes obtained through the light receiving means and its pinhole (i.e. a signal related to intensity changes of a reflected light component from the wafer mark), the center position of the wafer mark is determined and the alignment operation is done on the basis of the thus determined center position. As a further alternative, the invention is applicable to a position detecting method based on a dark field detection method, a diffraction interference method or the like.

Figure 11:
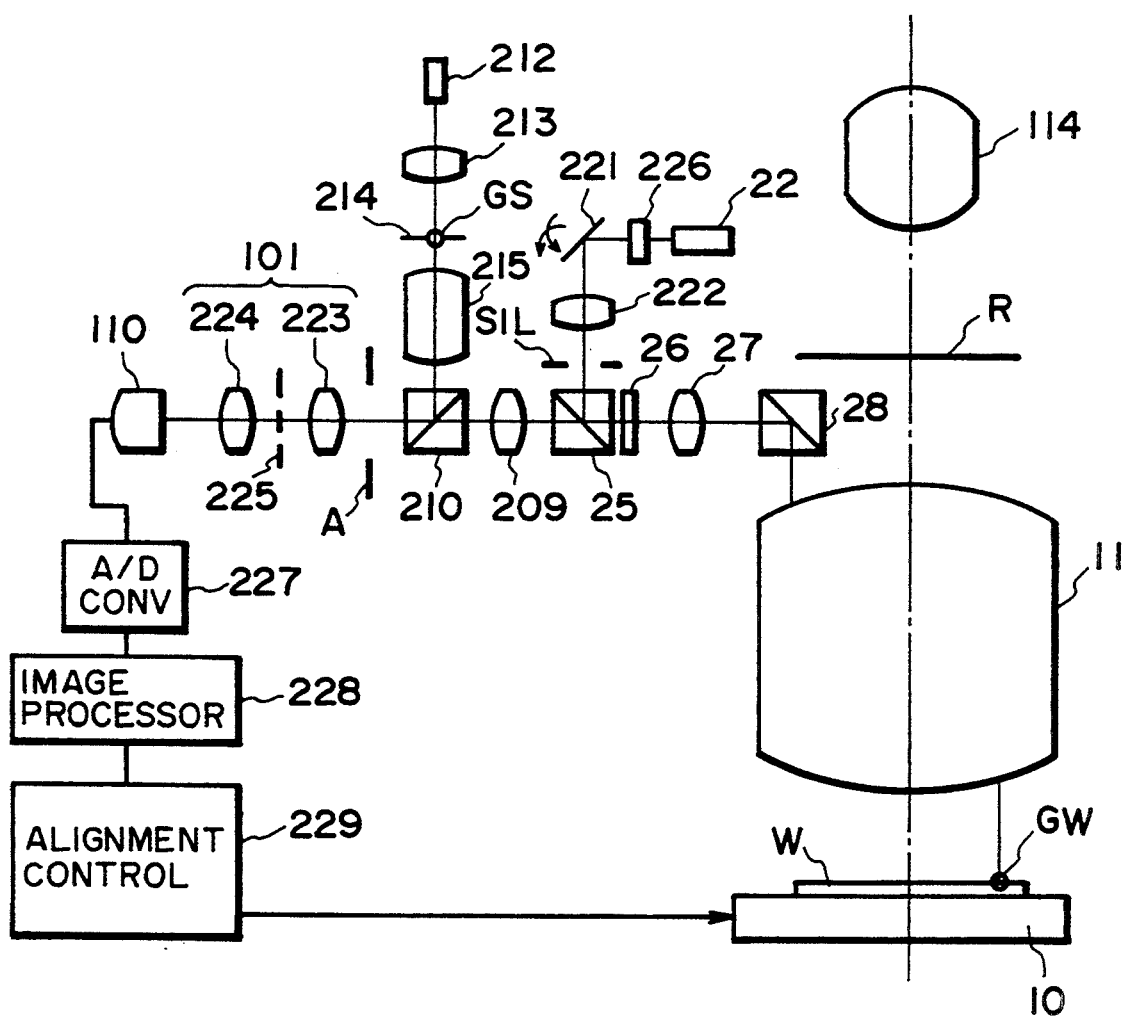
FIG. 11 is a schematic view of a major portion of the optical arrangement of another embodiment of the present invention.

FIG. 11 is a schematic view of a major portion of the optical arrangement of another embodiment of the present invention.

In this embodiment, like the exposure apparatus of the preceding embodiment, an electronic circuit pattern on a reticle R surface as illuminated with exposure light from an illumination system 114, is projected by a projection lens system 11 in a reduced scale, onto the surface of a wafer W placed on a wafer stage 10, whereby the pattern is lithographically transferred.

As for the alignment operation, a rectilinearly polarized light of a wavelength $\lambda$ different from the exposure light, emitted by a He-Ne laser 22, is inputted to an acousto-optic device (AO device) 226, by which the quantity of light directed to a mirror 221 is controlled.

For example, in a certain state, it is possible to block the light completely. Then, by means of the mirror 221 which is controllably rotatable about two axes, the light is reflected toward a predetermined direction and it is received by an F-θ lens 222.

A field stop SIL is disposed on a plane optically conjugate with the wafer W and it serves to spatially restrict the diameter of light. After being restricted, the light is received and reflected by a polarization beam splitter 25. The reflected light travels by way of a quarter waveplate 26, a lens 27, a mirror 28 and the projection lens system 11, and it illuminates a wafer mark GW provided on the wafer W surface.

Figure 12:
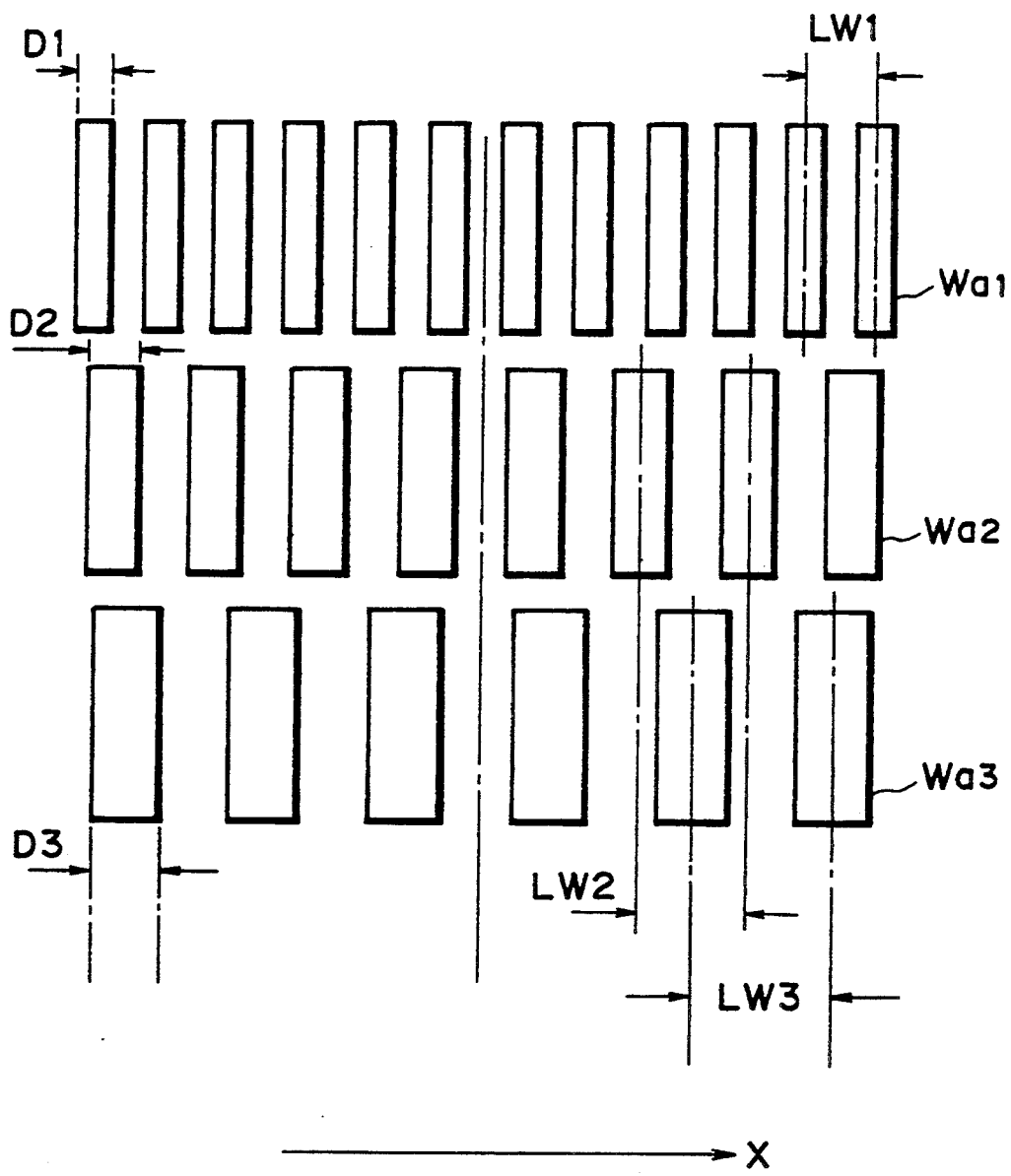
FIG. 12 is a schematic view of a wafer mark shown in FIG. 11.

FIG. 12 is a schematic view for explaining the wafer mark GW of FIG. 11. As illustrated, the wafer mark GW is provided by a plurality of alignment marks Wa each comprising a relief type diffraction grating having a different linewidth D and a different pitch LW.

More specifically, the wafer mark GW comprises three types of alignment marks Wa1, Wa2 and Wa3, formed by diffraction gratings of relief type (three-dimensional configuration) with different linewidths (while three types of alignment marks Wa1-Wa3 are shown in the drawing, the number may be modified as desired).

The alignment mark Wa1 has a linewidth D1 and a pitch LW1, and its mark elements are arrayed along the alignment direction (X-axis direction) equidistantly. The alignment mark Wa2 has a linewidth D2 and a pitch LW2 while the alignment mark Wa3 has a linewidth D3 and a pitch LW3 and, similarly to the alignment mark Wa1, the mark elements are arrayed along the alignment direction equidistantly.

Figure 14A:
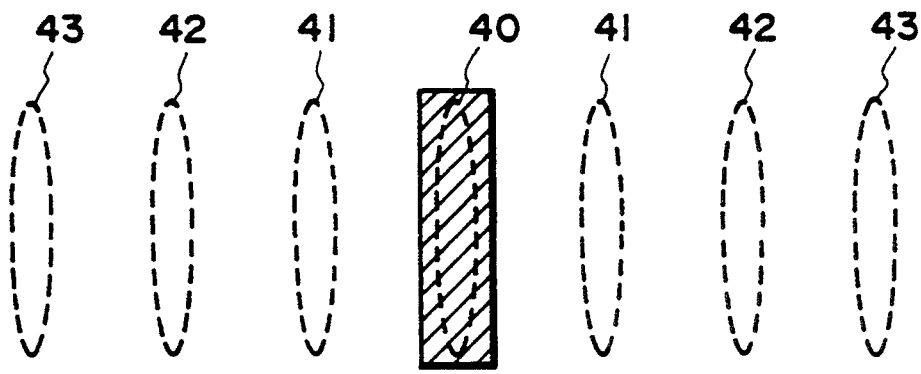
FIGS. 14(A)-(C) are schematic views for explaining the quantity distribution of illumination light upon the pupil of the optical system of FIG. 11.
Figure 14B:
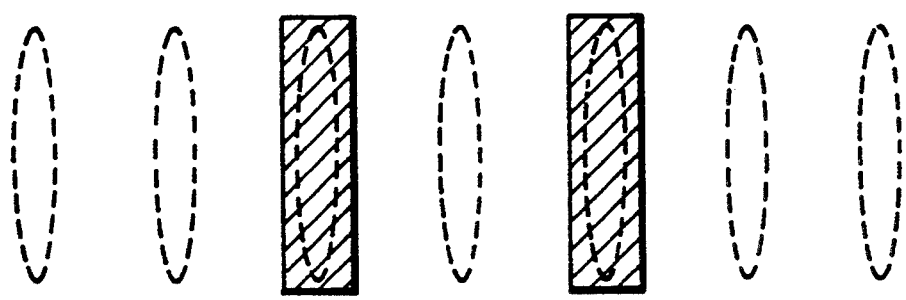

Here, with the cooperation of the light quantity control through the AO device 26 and the angular control to the mirror 21, the illuminating light in effect produces an on-axis effective light source such as depicted by hatching in FIG. 14(A), on the pupil plane of an optical system defined by the projection lens system 11, the lens 222 and 27.

The position of such effective light source on the pupil plane is within a zone in which zero-th order light is produced in response to perpendicular illumination of the wafer mark GW, and the rotatable mirror 21 and the AO device 26 are so controlled that only such zone is illuminated. In FIG. 14(A), zones 40-43 depicted by broken lines correspond to zero-th order, first order, second and third order diffraction lights, respectively.

Figure 14C:
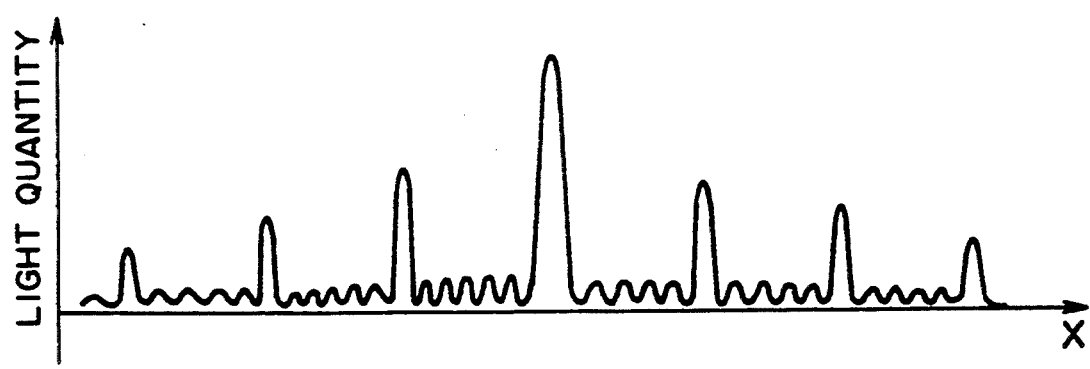

FIG. 14(C) illustrates details of distribution of diffraction lights produced in response to the perpendicular illumination of the wafer mark GW. The position of the zero-th order diffraction light which is at center, is unchanged for all the alignment marks Wa1, Wa2 and Wa3 of different pitches LW1, LW2 and LW3.

The light from the wafer mark GW on the wafer surface W passes through the projection lens system 11. After this, it travels by way of the mirror 28, the lens 27, the quarter waveplate 26, the polarization beam splitter 25 and a lens 29, and it forms an aerial image of the wafer mark GW at the position A.

Figure 13:
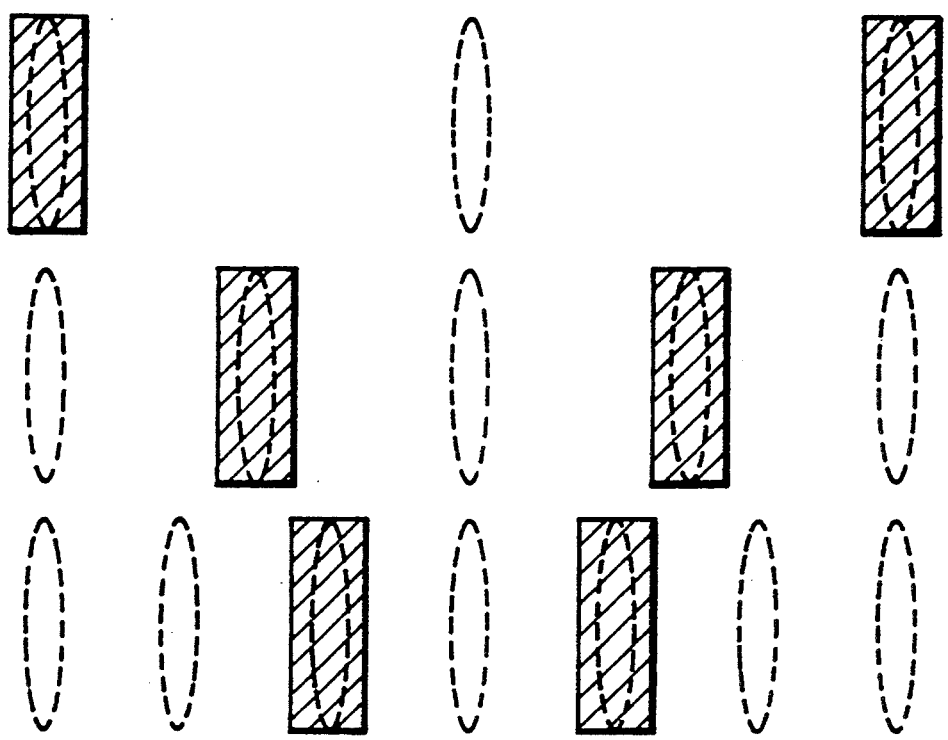
FIG. 13 is a schematic view for explaining diffraction lights to be extracted by a stopper (spatial filter) shown in FIG. 11.

The light forming the aerial image goes through a Fourier transformation lens 223 and, under the influence of a stopper (spatial frequency filter) 225, only those light rays of the reflectively diffracted light from the wafer mark GW each having an angle, with respect to the optical axis, which corresponds to $\sin^{-1}(\lambda/LWi)$ (i=1, 2, 3), are transmitted. The transmitted light travels through a Fourier transformation lens 224, and it forms an image of the wafer mark GW on a solid image pickup device (receiving means) 211. The stopper 225 has a central non-transparent area and a peripheral transparent area, and it serves to extract positive and negative first order diffraction light (see FIG. 13) from each mark element of the wafer mark GW which causes reflective diffraction such as shown in FIG. 15, and also it serves to block the zero-th order diffraction light.

On the other hand, the light from a light source such as a LED (light emitting diode) which emits a wavelength different from that emitted by the He-Ne laser 22, is concentrated by a condenser lens 213 to illuminate a reference mark GS formed on a reference mask 14.

Figure 16A:
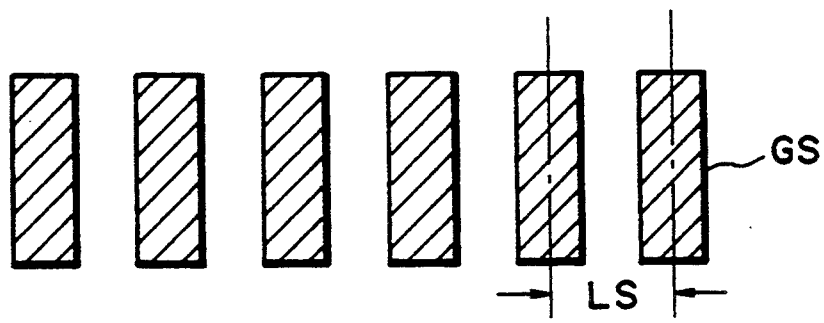
FIGS. 16(A)-(C) are schematic views showing a reference mark of FIG. 11 and an image thereof.

The reference mark GS comprises patterns such as shown in FIG. 16(A). Through the beam splitter 210 which serves to reflect the light from the reference mark (light from the LED) and to transmit the light from the He-Ne laser 22, an aerial image of the reference mark GS is formed on the plane A. After this, the aerial image on the plane A is re-imaged through the stopper 225 on the CCD 211, like the image of the wafer mark GW.

As best seen in FIG. 16(A), the reference mark GS comprises diffraction grating of a pitch LS, set with the same pitch as the pitch LW1 of the alignment marks Wa1 of the wafer mark GW. In FIG. 16(A), the hatching depicts transparent areas and the remainder depicts non-transparent area.

Figure 17:
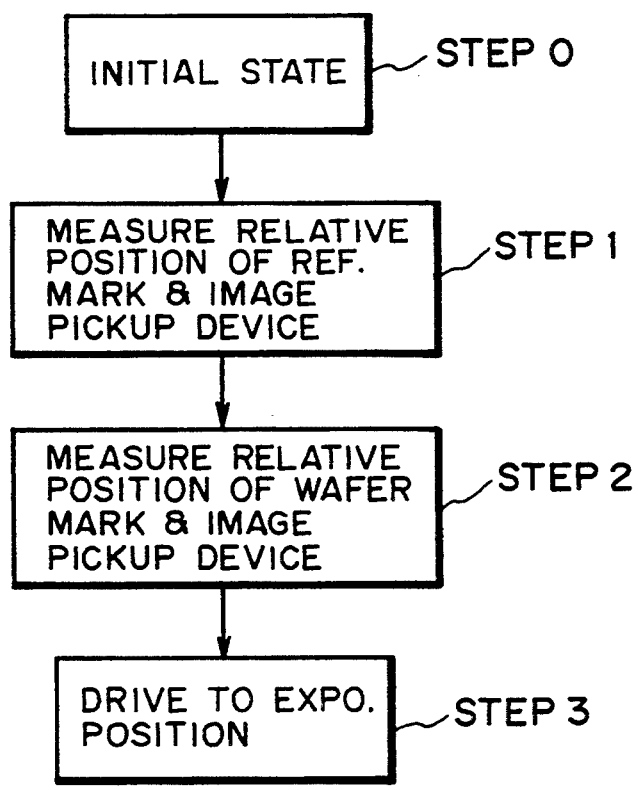
FIG. 17 is a flow chart of the alignment operation with the device of FIG. 11.

Referring now to the flow chart of FIG. 17, the alignment method according to this embodiment will be explained.

In the initial state at step 0, the relative position of the reticle R and the alignment device (e.g. CCD 110) has already been adjusted (aligned), and the correspondence between the origin of coordinate on the reticle R and the center of the reference mark GS has already been assured. Through the drive of the wafer stage ST, the wafer W has already been set at a predetermined site in the alignment device with a precision of microns order, to assure that when the wafer is illuminated by the He-Ne laser 22 the image of the wafer mark GW is picked up by the image pickup device (CCD) 110.

Figure 16B:
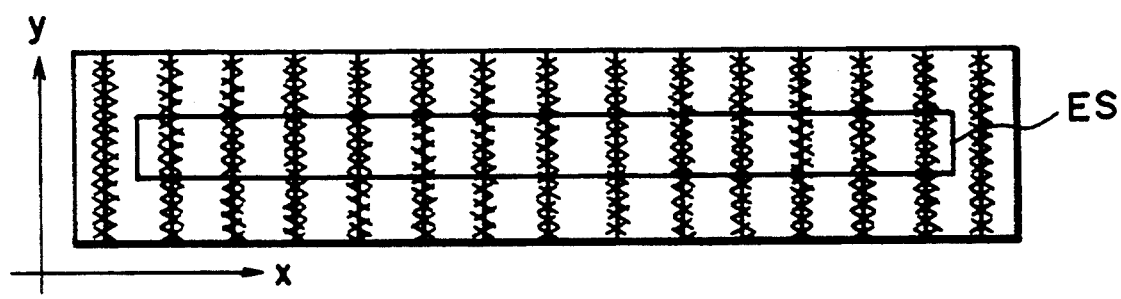
Figure 16C:
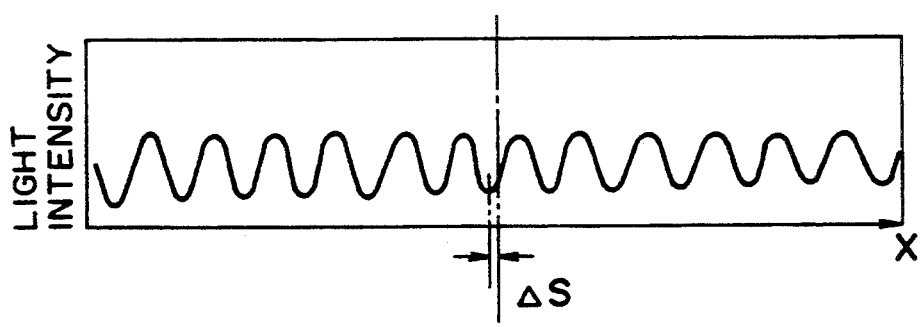

At step 1, the LED light source 212 is lit and the image of the reference mark GS is formed on the image pickup device 110. The formed image is such as shown in FIG. 16(B). Then, the electrical signal of the image pickup device 11 is transformed by an analog-to-digital converter (A/D converter) 27 into a two-dimensional formation. After this, an image processor 28 provides a processing window ES by which picture element integration is carried out in the Y-axis direction in FIG. 16(B), whereby an electrical signal of one-dimensional formation such as shown in FIG. 16(C) is obtained. Then, while taking the center of the picture plane as the origin, the FFT (fast Fourier transformation) operation is effected to measure a deviation ΔS from the center of the picture plane and to determine the positional relationship between the image pickup device 11 and the reference mark GS which is fixed to the alignment device.

Figure 18A:
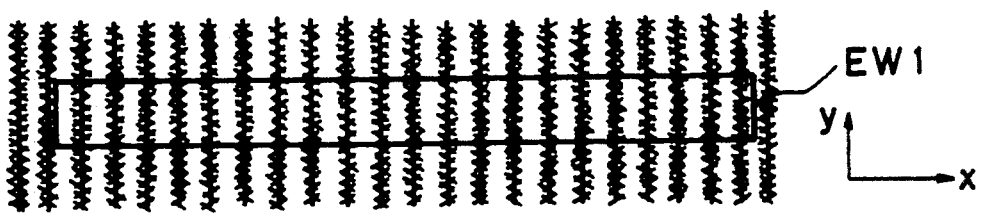
FIGS. 18(A)-(C) are schematic views of a wafer mark image on a CCD of FIG. 11.
Figure 18B:
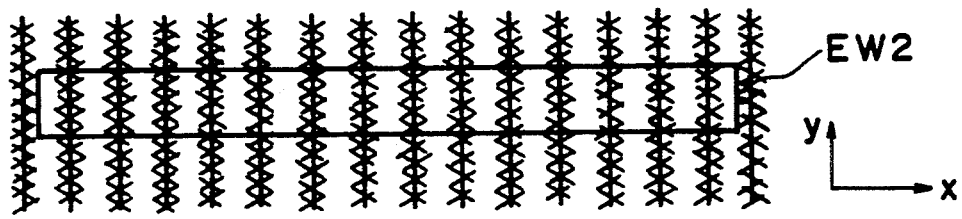
Figure 18C:
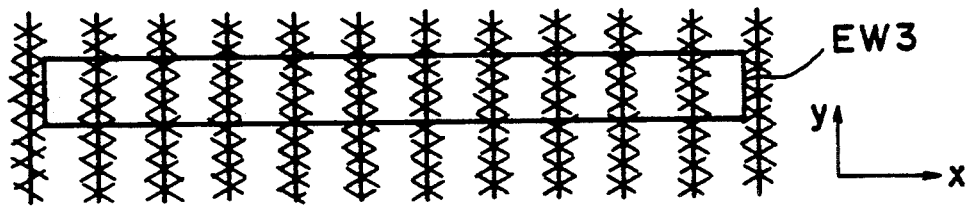
Figure 19:
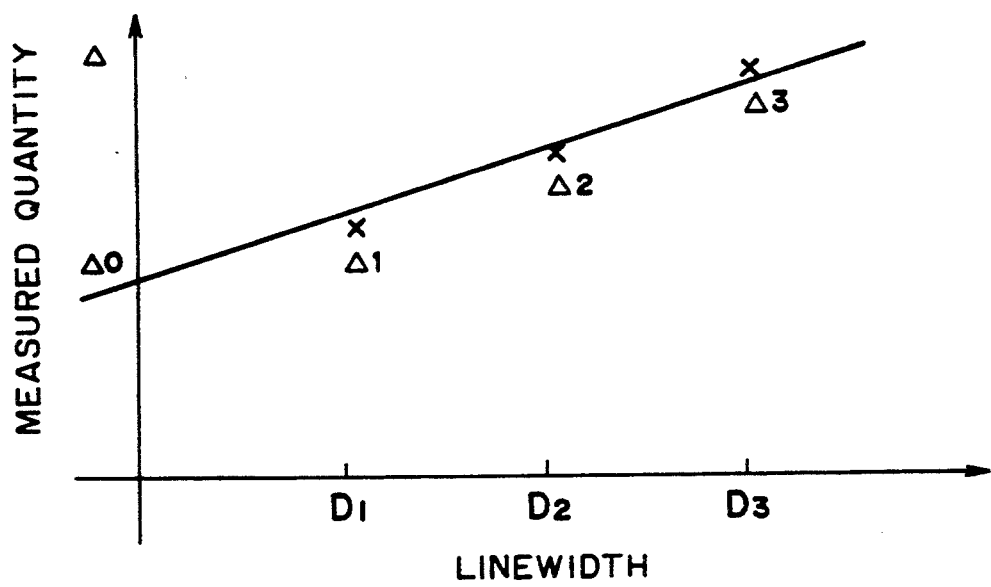
FIG. 19 is a schematic view for explaining the correction of misestimation in detecting the center position of the wafer mark.

At step 2, the He-Ne laser 22 is lit and the image of the wafer mark GW is formed on the image pickup device 110, along the path as described. The formed image is such as shown in FIG. 18. Then, the electrical signal from the image pickup device 110 is transformed by the A/D converter 227 into a two-dimensional formation (digital signal), and the image processor 228 provides processing windows EW1, EW2 and EW3, by which the picture element integration is carried out in the Y-axis direction in FIG. 18 whereby a one-dimensional formation is obtained. Subsequently, the FFT (fast Fourier transformation) operation is effected while taking the center of the picture plane as the origin, to measure deviations $\Delta 1$, $\Delta 2$ and $\Delta 3$ from the center of the picture plane. FIG. 19 shows the relationship of the deviations $\Delta 1$, $\Delta 2$ and $\Delta 3$ with the linewidth. In FIG. 19, each reference x denotes a measured quantity. On the basis of an equation on the relationship between the linewidth and the error of measured quantity attributable to the non-uniformness of resist coating and the wafer mark GW as well as the measured quantities (in this embodiment, as a linear approximation, a linear equation is used as the relational equation) and according to the least square method, the real quantity $\Delta 0$ of positional deviation in the state in which the alignment mark Wa has a zero linewidth is determined. In other words, the real position of the wafer mark GW relative to the position of the image pickup device 11 is determined.

At step 3, the real positional deviation of the wafer W and the alignment device is converted into the coordinate with respect to the reticle R, and by using the alignment control device 229, the wafer stage ST is driven to bring the wafer to a predetermined site for the exposure operation. By this, the alignment operation is accomplished.

In this embodiment, the mirror 21 which is controllably rotatable about two axes may be replaced by a combination of two mirrors each being controllably rotatable about a single axis. Further, it may be provided by using an acousto-optic (AO) device or an electro-optic (EO) device, or a polygonal mirror.

In this embodiment, a positional deviation between the wafer mark GW and the reference mark GS is detected. However, in place of the reference mark GS, a reticle mark on the reticle may be imaged on the image pickup device and any positional deviation between the imaged reticle mark and the wafer mark may be detected directly.

Additionally, in place of imaging the reference mark on the image pickup device, a virtual reference mark may be set in the image memory into which the signal from the image pickup device is to be memorized, and this may be used in place of the actual reference mark.

Figure 20:
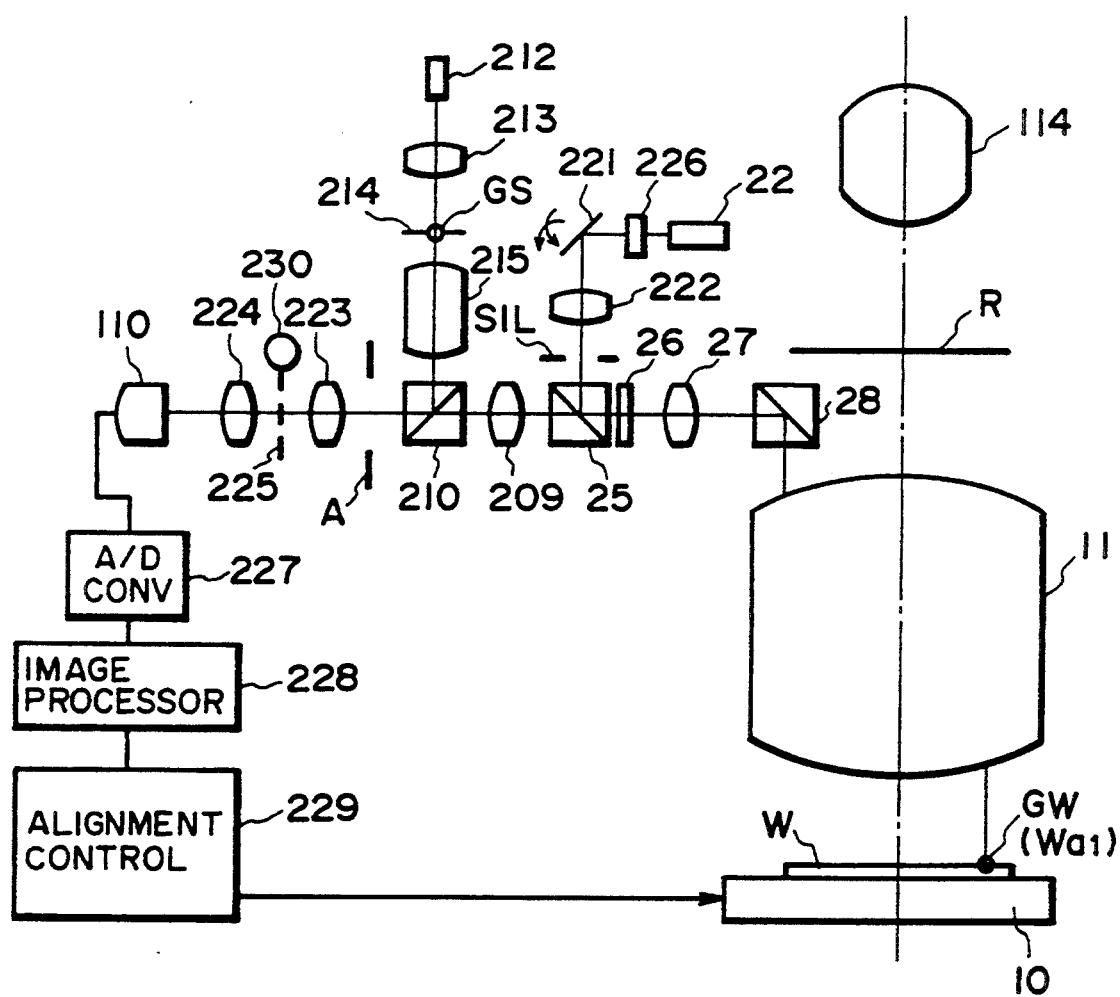
FIG. 20 is a schematic view of a major portion of the optical arrangement of a further embodiment of the present invention.

FIG. 20 is a schematic view of a major portion of the optical arrangement of a further embodiment of the present invention. Like the preceding embodiment, an electronic circuit pattern on a reticle R surface as illuminated with exposure light from an illumination device 114, is projected by a projection lens system 11 in a reduced scale onto the surface of a wafer W, placed on a wafer stage 10, by which the pattern is lithographically transferred.

Linearly polarized light of a wavelength $\lambda$ different from the exposure light, emitted by a He-Ne laser 22, is inputted to an acousto-optic device (AO device) 226, by which the quantity of light directed to a mirror 221 is controlled. For example, in a certain state, the light can be completely blocked. Then, the light is reflected by a mirror 221 which is controllably rotatable about two axes, into an F-$\theta$ lens 22.

A field stop SIL is disposed on a plane optically conjugate with the wafer W and it serves to adjust the beam diameter to thereby spatially restrict the range of illumination on the wafer surface. After being restricted, the light is received and reflected by a polarization beam splitter 25. The reflected light travels by way of a quarter waveplate 26, a lens 27, a mirror 28 and the projection lens system 11, and it illuminates a wafer mark GW provided on the wafer W surface.

Figure 21A:
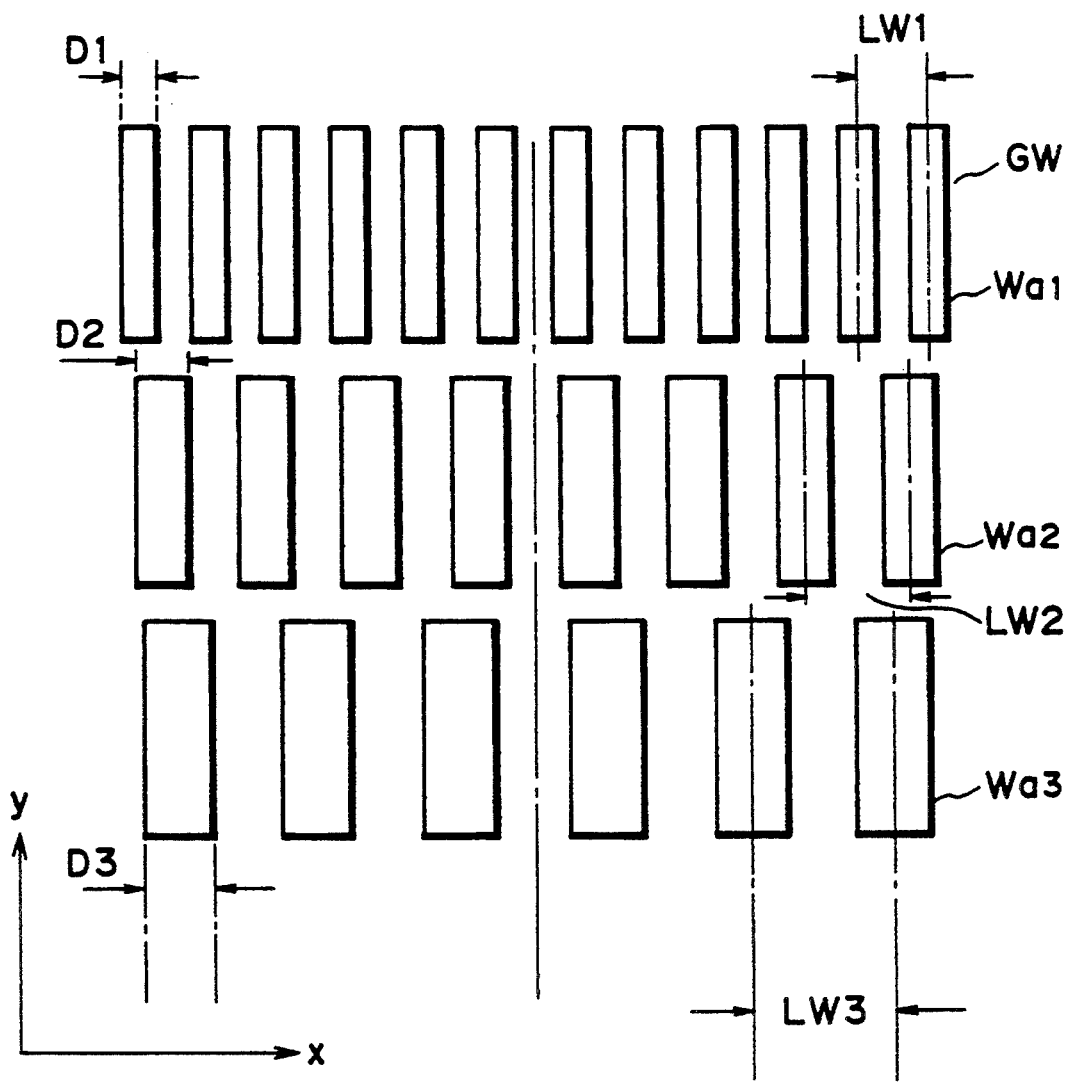
FIGS. 21 (A) and (B) are schematic views showing a wafer mark used in FIG. 20.
Figure 21B:
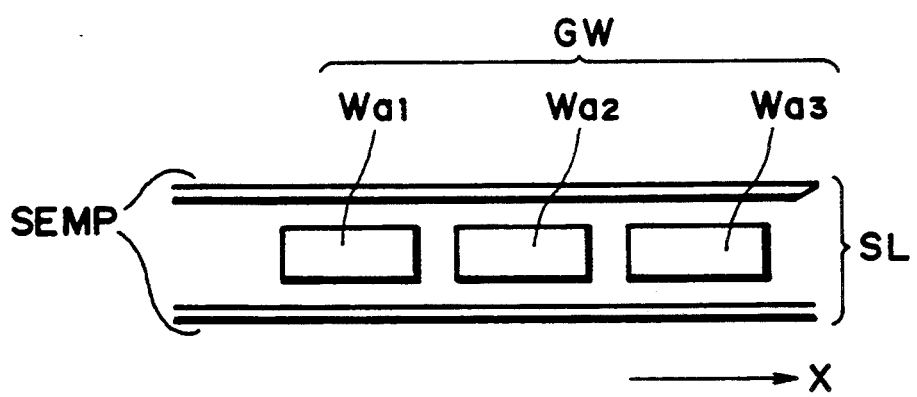

FIGS. 21(A) and 21(B) are schematic views for explaining the wafer mark GW of FIG. 20. As illustrated in part (A) of FIG. 21, the wafer mark GW is provided by a plurality of alignment marks Wa (Wa1-Wa3) each comprising a relief type diffraction grating having a different linewidth D and a different pitch LW. As seen in 21(B) FIG. 21, these alignment marks Wa (Wa1-Wa3) of the wafer mark GW are disposed in different regions on a scribe line SL. Denoted at SEMP is a pattern region for semiconductor processes.

More specifically, the wafer mark GW comprises three types of alignment marks Wa1, Wa2 and Wa3, formed by diffraction gratings of relief type (three-dimensional configuration) with different linewidths (while three types of alignment marks Wa1-Wa3 are shown in the drawing, the number may be modified as desired).

The alignment mark Wa1 has a linewidth D1 and a pitich LW1, and its mark elements are arrayed along the alignment direction (X-axis direction) equidistantly. The alignment mark Wa2 has a linewidth D2 and a pitch LW2 while the alignment mark Wa3 has a linewidth D3 and a pitch LW3 and, similarly to the alignment mark Wa1, the mark elements are arrayed along the alignment direction equidistantly. (In this embodiment, each alignment mark is not limited to a diffraction grating pattern, and a single isolated pattern (see FIG. 27) may be used.)

Figure 22A:
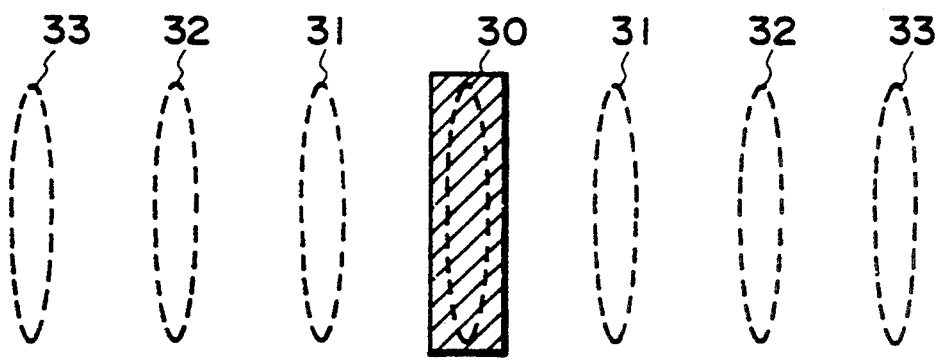
FIGS. 22 (A)-(C) are schematic views showing the quantity distribution of illumination light upon the pupil of the optical system in FIG. 20.
Figure 22B:
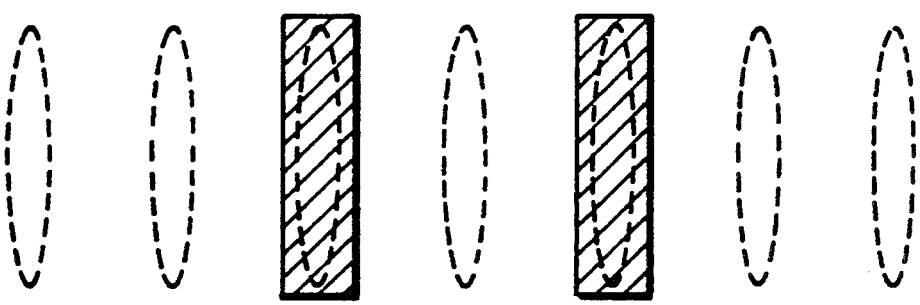

Here, with the cooperation of the light quantity control through the AO device 226 and the angular control to the mirror 221, the illuminating light in effect produces an effective light source such as depicted by hatching in FIG. 22(A), on the pupil plane of an optical system defined by the projection lens system 11, the lens 222 and 27.

The position of such an effective light source on the pupil plane is within a zone in which zero-th order light is produced in response to perpendicular illumination of the wafer mark GW, and the rotatable mirror 21 and the AO device 26 are so controlled that only such zone is illuminated. Zones 40-43 depicted by broken lines correspond to zero-th order, first order, second order and third order diffraction lights, respectively.

Figure 22C:
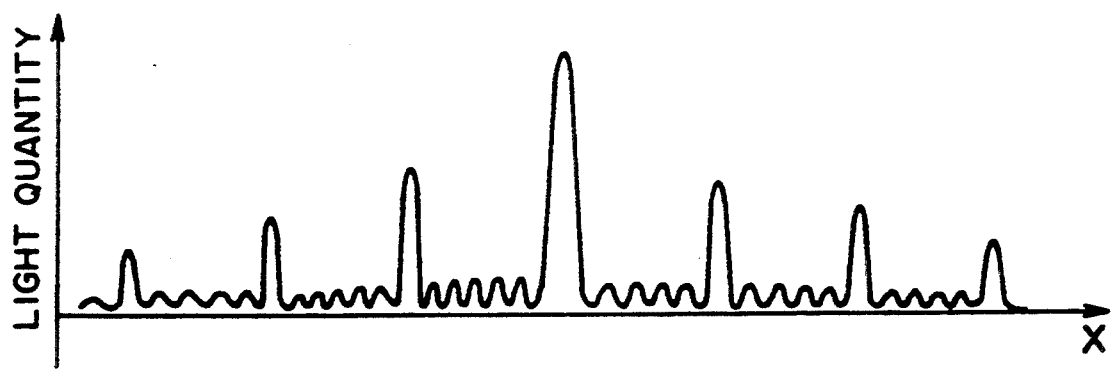

FIG. 22(C) illustrates details of distribution of diffraction lights produced in response to the perpendicular illumination of the wafer mark GW.

Figure 23:
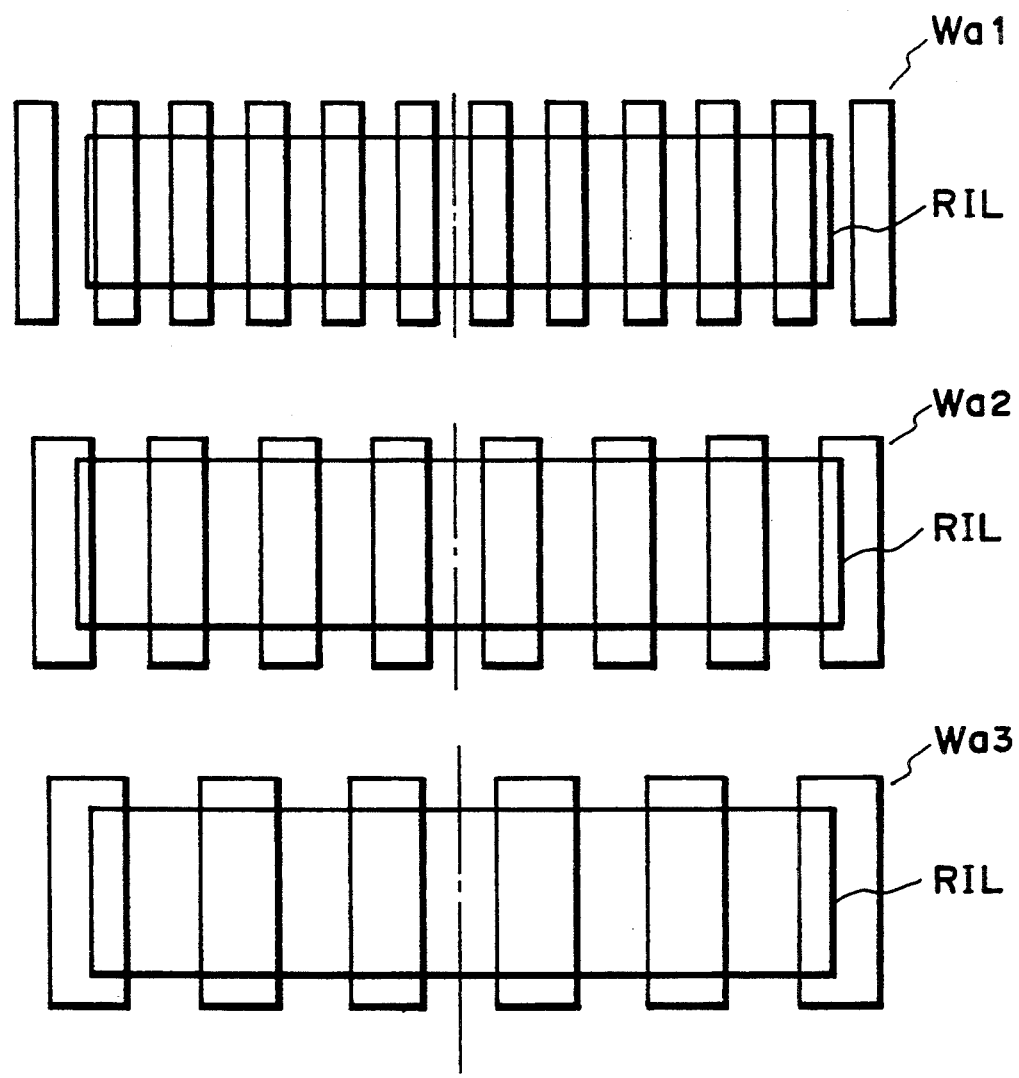
FIG. 23 is a schematic view, showing the range of illumination on the wafer in FIG. 20.

FIG. 23 is a schematic view for explaining the range of illumination on the wafer W surface. As illustrated, the filed stop SIL is so disposed that only a portion RIL of the grating pattern of each alignment mark Wa1, Wa2 and Wa3 is illuminated.

Of the light from the wafer mark GW on the wafer surface W, the light from the alignment mark Wa1 passes through the projection lens system 11. After this, it travel by way of the mirror 28, the lens 27, the quarter waveplate 26, the polarization beam splitter 25, a lens 29 and a beam splitter 210, and it forms an aerial image of the alignment mark Wa1 at the position A. This is also the case with the light from the alignment mark Wa2 or Wa3.

The light forming the aerial image travel through a Fourier transformation lens 223 and, under the influence of a stopper 225, having three types of stoppers 25a, 25b and 25c, only positive and negative first order diffraction lights of the reflected lights from the wafer mark GW, having an angle of emission from the wafer W corresponding to $\sin^{-1}(\lambda/LWi)$ (i=1, 2, 3), are transmitted. The transmitted light travel through a Fourier transformation lens 224, and it forms an image of the wafer mark GW on a solid image pickup device (receiving means) 110.

Figure 24A:
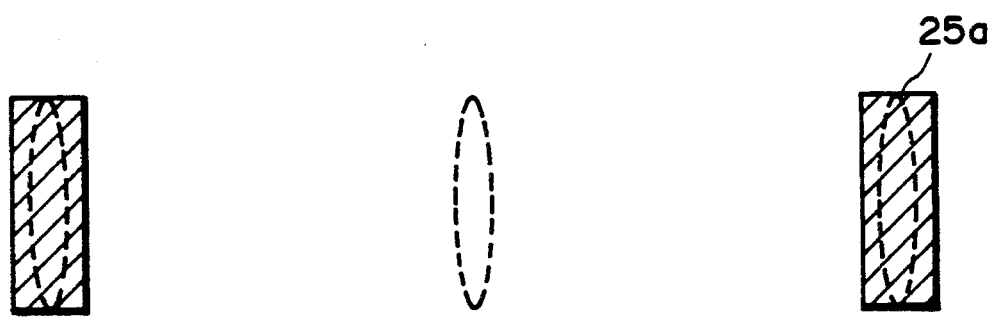
FIGS. 24 (A)-(C) are schematic views of the stopper in FIG. 20.
Figure 24B:
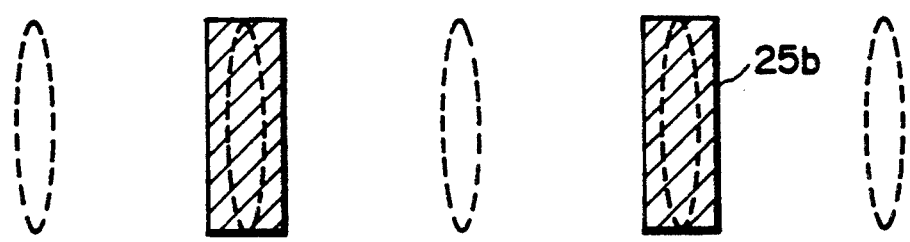
Figure 24C:
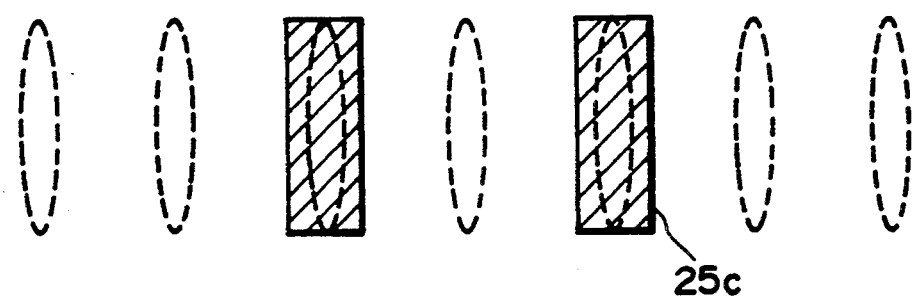

FIGS. 24(A)–24(C) shows details of the stopper 225. The hatching in the drawing depicts transmitting areas. This stopper serves to block zero-th order light and to extract positive and negative first order diffraction light.

The stopper 225 of the present embodiment has light transmitting areas (hatched areas in FIGS. 24(A)–24(C), and it is controllably driven by a stopper controller 30 so that, in accordance with the alignment mark (Wa1, Wa2 or Wa3), corresponding one of the light transmitting areas is positioned on the path of light. Thus, in the present embodiment, images of the alignment marks Wa1, Wa2 and Wa3 are formed sequentially.

The present embodiment uses three types of stoppers such as illustrated in FIGS. 24(A)–(C), having paired light transmitting areas 25a, 25b and 25c, respectively, which are used for the imaging of the alignment marks Wa1, Wa2 and Wa3, respectively.

As an alternative, three separate stoppers having different light transmitting areas may be used for the alignment marks, respectively.

On the other hand, the light from a light source 212 such as an LED (light emitting diode) which emits a wavelength different from that emitted by the He-Ne laser 22, in concentrated by a condenser lens 213 to illuminate a reference mark GS formed on a reference mask 214.

The reference mark GS comprises patterns such as shown in FIG. 16(A). Through the beam splitter 210 which serves to reflect the light from the reference mark (light from the LED) and to transmit the light from the He-Ne laser 22, an aerial image of the reference mark GS is formed on the plane A. After this, the aerial image on the plane A is re-imaged on the CCD 211, like the image of the wafer mark GW.

As best seen in FIG. 16(A), the reference mark GS comprises diffraction grating of a pitch LS, set so that the same pitch as the pitch LW1 of the alignment marks Wa1 of the wafer mark GW is assured on the CCD 211. In FIG. 16(A), the hatching depicts transparent areas and the remainder depicts non-transparent area.

Figure 25:
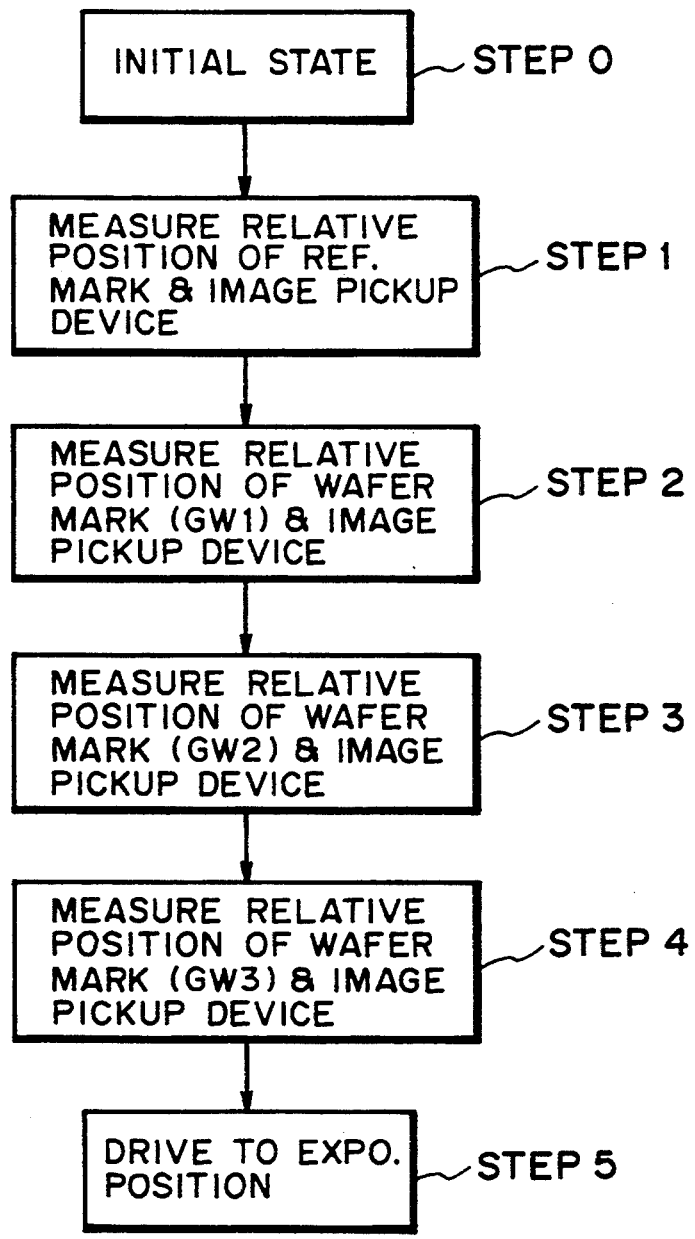
FIG. 25 is a flow chart of the alignment operation with the device of FIG. 20.

Referring now to the flow chart of FIG. 25, the alignment method according to this embodiment will be explained.

In the initial state at step 0, the relative position of the reticle R and the alignment device (e.g. CCD 110) has already been adjusted (aligned), and the correspondence between the origin of coordinate on the reticle R and the center of the reference mark GS has already been assured. Through the drive of the wafer stage ST, the wafer W has already been set at a predetermined site in the alignment device with a precision of microns order, to assure that when the wafer is illuminated by the He-Ne laser 22 the image of the wafer mark GW is picked up by the image pickup device (CCD) 110. At this time, the stopper 225 is so set that the stopper shown in FIG. 24(A), is positioned on the optical axis.

At step 1, the LED light source 212 is lit and the image of the reference mark GS is formed on the image pickup device 110. The formed image is such as shown in FIG. 16(B). Then, the electrical signal of the image pickup device 11 is transformed by an analog-to-digital converter (A/D converter) 27 into a two-dimensinal formation. After this, an image processor 28 provides a processing window ES by which picture element integration is carried out in the Y-axis direction in FIG. 16, part (B), whereby an electrical signal of one-dimensional formation such as shown in FIG. 16(B) is obtained. Then, while taking the center of the picture plane as the origin, the FFT (fast Fourier transformation) operation is effected to measure a deviation $\Delta S$ from the center of the picture plane corresponding to the basic frequency and to determine the positional relationship between the image pickup device 11 and the reference mark GS which is fixed to the alignment device. In response, the illumination by the LED 212 is ceased.

At step 2, the He-Ne laser 22 is lit and the image of the alignment mark Wa1, of the wafer mark GW, is formed on the image pickup device 211, along the path as described. The formed image is such as shown in FIG. 18(A). Then, the electrical signal from the image pickup device 110 is transformed by the A/D converter 227 into a two-dimensional formation (digital signal), and the image processor 228 provides a processing window EW1 by which the picture element integration is carried out in the Y-axis direction in FIG. 18 whereby a one-dimensional formation is obtained. Subsequently, the FFT (fast Fourier transformation) operation is effected while taking the center of the picture plane as the origin, to measure a deviation $\Delta 1$ from the center of the picture plane corresponding to the basic frequency, and the measured deviation is memorized.

At step 3, the wafer stage 10 is moved through a predetermined distance (corresponding to the design positional difference between the alignment marks Wa1 and Wa2), and the stopper controller 30 operates to adjust the stopper 225 so that the stopper 25b shown in FIG. 24(B) is positioned on the light path. Then, the He-Ne laser 22 is lighted and the image of the alignment mark Wa2 is formed on the image pickup device 211, along the path as described. The formed image is such as shown in FIG. 18(B). Then, the electrical signal from the image pickup device 110 is transformed by the A/D converter 227 into a two-dimensional formation (digital signal), and the image processor 228 provides a processing window EW2 by which the picture element integration is carried out in the Y-axis direction in FIG. 18 whereby a one-dimensional formation is obtained. Subsequently, the FFT (fast Fourier transformation) operation is effected while taking the center of the picture plane as the origin, to measure a deviation $\Delta 2$ from the center of the picture plane corresponding to the basic frequency, and the measured deviation is memorized.

At step 4, the wafer stage 10 is moved through a predetermined distance (corresponding to the design positional difference between the alignment marks Wa2 and Wa3), and the stopper controller 30 operates to adjust the stopper 225 so that the stopper 25c shown in FIG. 24(C) is positioned on the light path. Then, the He-Ne laser 22 is lit and the image of the alignment mark Wa3 is formed on the image pickup device 211, along the path as described. The formed image is such as shown in FIG. 18(C). Then, the electrical signal from the image pickup device 110 is transformed by the A/D converter 227 into a two-dimensional formation (digital signal), and the image processor 228 provides a processing window EW3 by which the picture element integration is carried out in the Y-axis direction in FIG. 18 whereby a one-dimensional formation is obtained. Subsequently, the FFT (fast Fourier transformation) operation is effected while taking the center of the picture plane as the origin, to measure a deviation $\Delta 3$ from the center of the picture plane corresponding to the basic frequency, and the measured deviation is memorized.

FIG. 19 shows the relationship of the deviations $\Delta 1$, $\Delta 2$ and $\Delta 3$ with the linewidth. In FIG. 19, each reference x denotes a measured quantity. On the basis of an equation on the relationship between the linewidth and the error of measured quantity attributable to the non-uniformness of resist coating and the wafer mark GW as well as the measured quantities (in this embodiment, as a linear approximation, a linear equation is used as the relational equation) and according to the least square method, the real quantity $\Delta 0$ of positional deviation in the state in which the alignment mark Wa has a zero linewidth is determined. In other words, the real position of the wafer mark GW relative to the position of the image pickup device 11 is determined.

At step 5, the real positional deviation of the wafer W and the alignment device is converted into the coordinate with respect to the reticle R, and by using the alignment control device 229, the wafer stage ST is driven to bring the wafer to a predetermined site for the exposure operation. By this, the alignment operation is accomplished.

In the present embodiment, by using the alignment marks Wa1-Wa3 having different linewidths, measurements are effected at different time moments. However, as an example, the alignment marks may be separated into two groups such that the alignment marks Wa1 and Wa2 are measured simultaneously while the alignment mark Wa3 is measured at a different time.

Figure 32:
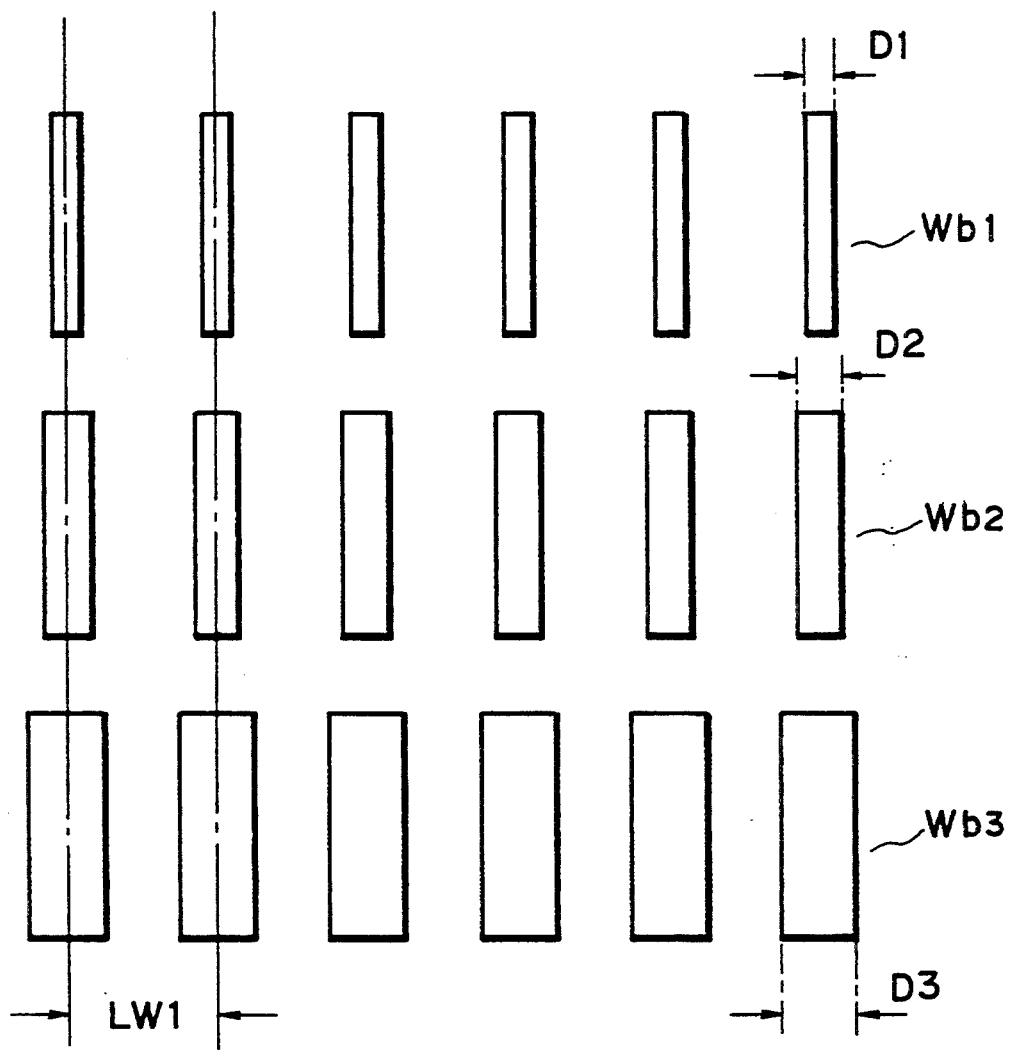
FIG. 32 is a schematic view, showing another example of wafer mark.

Further, in this embodiment, the alignment marks are different both in the pitch LW and in the linewidth D. But, as the alignment marks Wb1-Wb3 shown in FIG. 32, the alignment marks may have the same pitch LW and different linewidths D.

Figure 34A:
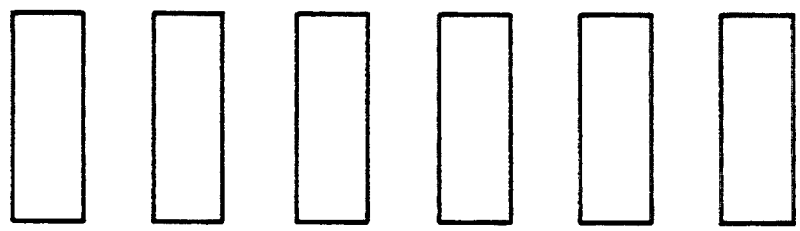
FIGS. 34(A)-(D) are schematic views showing another example of wafer mark.
Figure 34B:
Figure 34C:
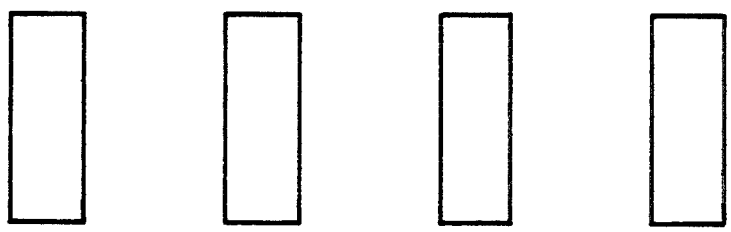
Figure 34D:
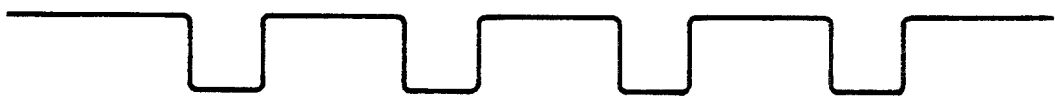

In that case, since the alignment marks has the same pitch LW as the diffraction grating, the stopper controller 30 shown in FIG. 20 is unnecessary. As regards the stopper 225, only the stopper having a pair of light transmitting ares 25a shown in FIG. 24(A) may be used. Here, the relationship between the linewidth and the quantity of deviation is in conformity with a quadratic function such as shown in FIG. 23, for example. Thus, in this case, by using the measured quantities $\Delta 1b$, $\Delta 2b$ and $\Delta 3b$ as well as the data of the linewidths D1, D2 and D3, the coefficient of the quadratic function is determined in accordance with the least square method and, from this quadratic function, the limit of the linewidth $D=0$ is detected as the real positional deviation.

Where the same linewidth but different pitches LW are used such as shown in FIGS. 34, 34(A) and 34(C) the sectional shapes of the marks (FIGS. 34(B) and 34(C) are like the case where the linewidth is in effect changed. For this reason, it is possible to attain substantially the same advantageous effects as described hereinbefore.

FIG. 26 is a schematic view of a major portion of the optical arrangement of a further embodiment of the present invention.

An electronic circuit pattern on a reticle R surface as illuminated with exposure light from an illumination device 114, is projected by a projection lens system 11 in a reduced scale onto the surface of a wafer W, placed on a wafer stage 10, by which the pattern is lithographically transferred.

Linearly polarized light of a wavelength $\lambda$ different from the exposure light, emitted by a He-Ne laser 22, is inputted to an acousto-optic device (AO device) 226, by which the quantity of light directed to a mirror 221 is controlled. For example, in a certain state, the light can be completely blocked. Then, the light is reflected by a mirror 221 which is controllably rotatable about two axes, into an F-$\theta$ lens 22.

A field stop SIL is disposed on a plane optically conjugate with the wafer W and it serves to adjust the beam diameter to thereby spatially restrict the range of illumination on the wafer surface. After being restricted, the light is received and reflected by a polarization beam splitter 25. The reflected light travels by way of a quarter waveplate 26, a lens 27, a mirror 28 and the projection lens system 11, and it illuminates a wafer mark MW provided on the wafer W surface.

Figure 27:
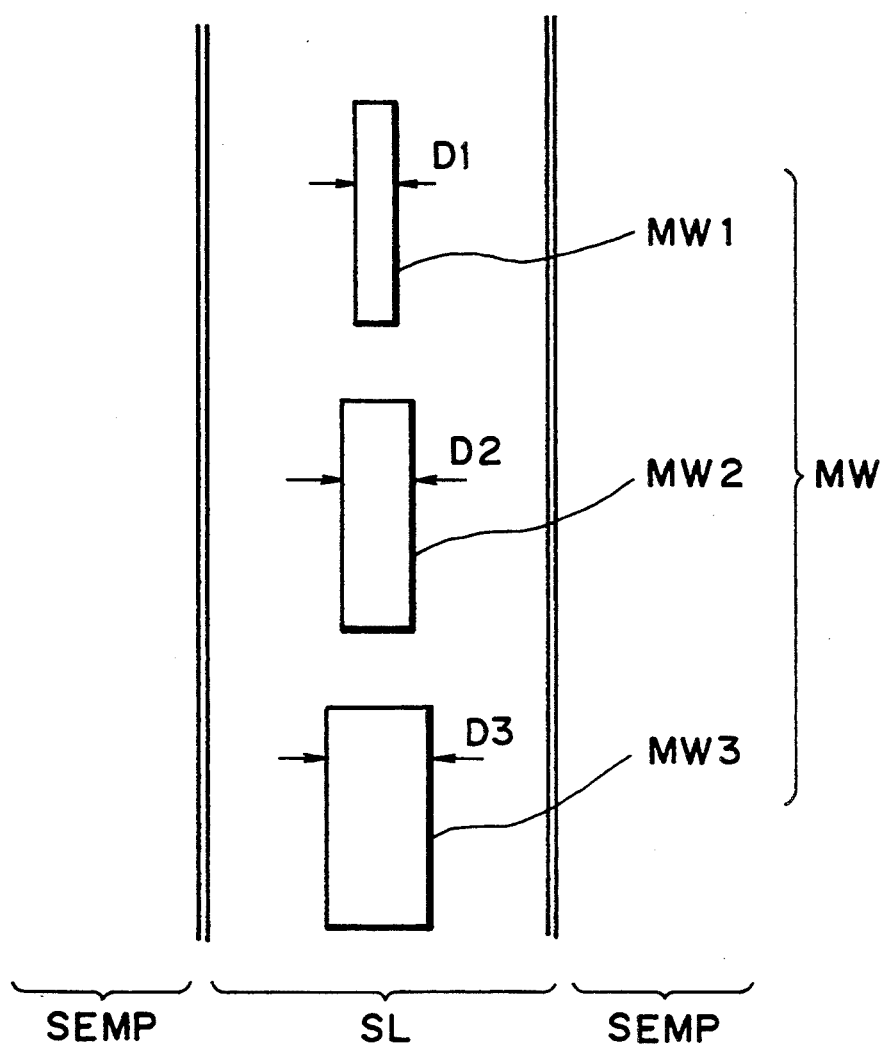
FIG. 27 is a schematic view of wafer marks of FIG. 26.

FIG. 27 is a schematic view for explaining the wafer mark MW of FIG. 26. As illustrated, the wafer mark MW is provided by three alignment marks MW1, MW2 and MW3 having different linewidths D. Each alignment mark is formed by a single pattern of a linewidth D1, D2 or D3, and is formed on a scribe line SL.

Here, with the cooperation of the light quantity control through the AO device 226 and the angular control to the mirror 221, the illuminating light in effect produces a circular effective light source on the pupil plane of an optical system defined by the projection lens system 11, the lens 222 and 27.

The light from the wafer mark MW on the wafer surface W travels by way of the projection lens system 11, the mirror 28, the lens 27, the quarter waveplate 26, the polarization beam splitter 25, a lens 29, a beam splitter 210 and an image pickup lens 31, and it forms an image of the wafer mark MW on the surface of an image pickup device 211.

Figure 28A:
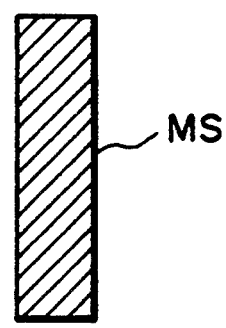
FIGS. 28 (A)-(C) are schematic views of a reference mark of FIG. 26.

On the other hand, the light from a light source 212 such as an LED (light emitting diode) which emits a wavelength different from that emitted by the He-Ne laser 22, is concentrated by a condenser lens 213 to illuminate a reference mark MS formed on a reference mask 214. The reference mark MS comprises patterns such as shown in of FIG. 28(A).

In the drawing, the hatching depicts a light transmitting area. Through the beam splitter 210 which serves to reflect the light from the reference mark (light from the LED) and to transmit the light from the He-Ne laser 22, an image of the reference mark MS is formed on the image pickup device 110.

Figure 29:
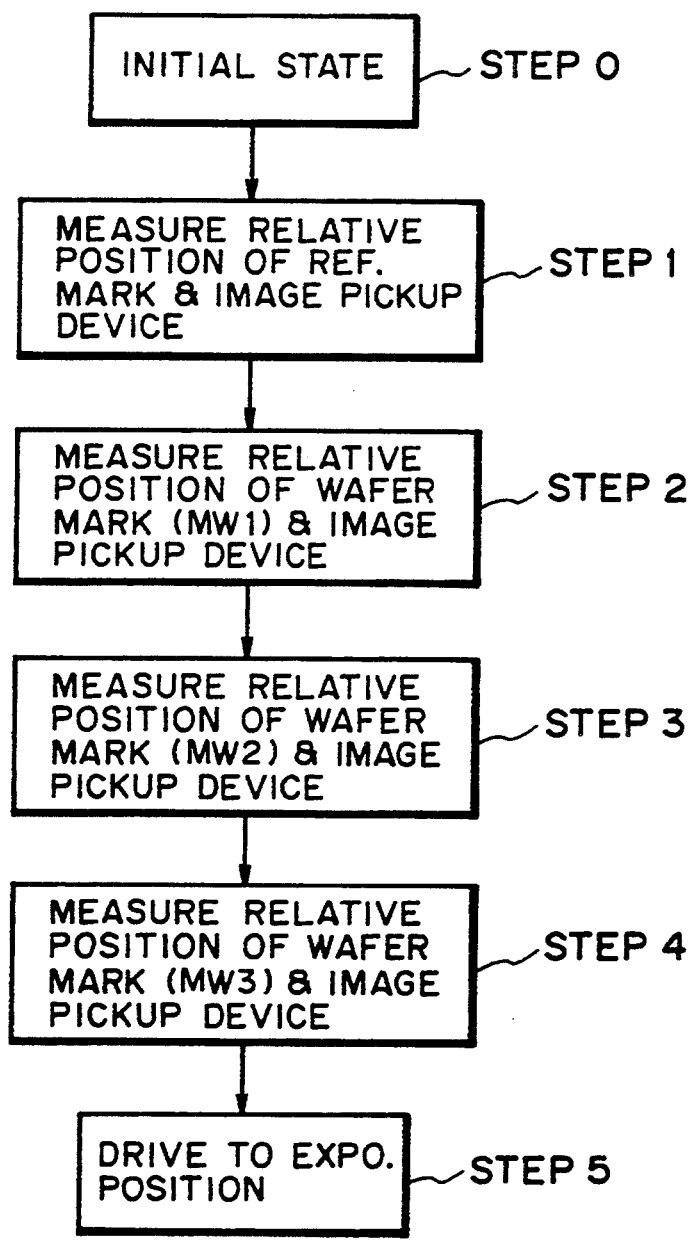
FIG. 29 is a flow chart of the alignment operation with the device of FIG. 26.

Referring now to the flow chart of FIG. 29, the alignment method according to this embodiment will be explained.

In the initial state at step 0, the relative position of the reticle R and the alignment device (e.g. image pickup device 110) has already been adjusted (aligned), and the correspondence between the origin of coordinate on the reticle R and the center of the reference mark MS has already been assured. Through the drive of the wafer stage ST, the wafer W has already been set at a predetermined site in the alignment device with a precision of microns order, to assure that when the wafer is illuminated by the He-Ne laser 22 the image of the wafer mark MW is picked up by the image pickup device 110.

Figure 28B:
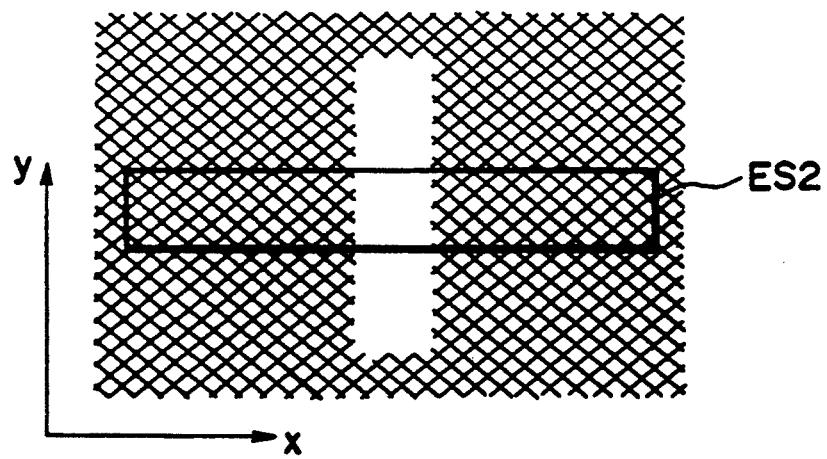
Figure 28C:
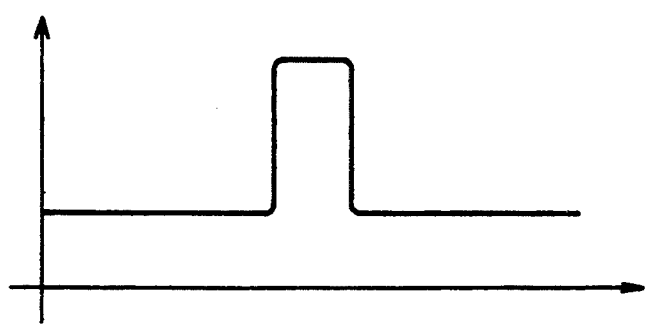

At step 1, the LED light source 212 is lit and the image of the reference mark MS is formed on the image pickup device 110. The formed image is such as shown in FIG. 28(B). Then, the electrical signal of the image pickup device 11 is transformed by an analog-to-digital converter (A/D converter) 27 into a two-dimensional formation. After this, an image processor 28 provides a processing window ES2 by which picture element integration is carried out in the Y-axis direction in FIG. 28(B), whereby an electrical signal of one-dimensional formation such as shown in FIG. 28(C) is obtained. Then, while taking the center of the picture plane as the origin, the one-dimensional pattern matching operation is effected to measure a deviation ΔS of the reference mark MS from the center of the picture plane, and the positional relationship between the image pickup device 11 and the reference mark MS which is fixed to the alignment device, is determined. In response, the illumination by the LED 212 is ceased.

Figures 30A, 30B, 30C:
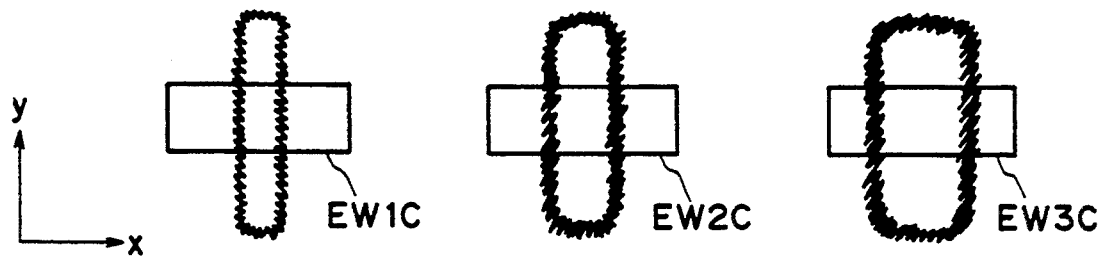
FIGS. 30(A)-(F) are schematic views of an image of the wafer mark of FIG. 26.
Figures 30D, 30E, 30F:
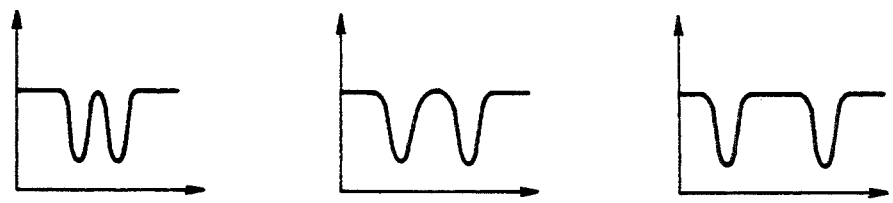

At step 2, the He-Ne laser 22 is lit and the image of the alignment mark MW1, of the wafer mark MW, is formed on the image pickup device 211, along the path as described. The formed image is such as shown in FIG. 30(A). Then, the electrical signal from the image pickup device 110 is transformed by the A/D converter 227 into a two-dimensional formation (digital signal), and the image processor 228 provides a processing window EW1c by which the picture element integration is carried out in the Y-axis direction in FIG. 30 whereby a one-dimensional formation (FIG. 30(C)) is obtained. Subsequently, the one-dimensional pattern matching operation is effected while taking the center of the picture plane as the origin, to measure a deviation Δ1c of the mark center from the center of the picture plane, and the measured deviation is memorized.

At step 3, the wafer stage 10 is moved through a predetermined distance (corresponding to the design positional difference between the alignment marks MW1 and MW2). Then, the He-Ne laser 22 is lit and the image of the alignment mark MW2 is formed on the image pickup device 110, along the path as described. The formed image is such as shown in FIG. 30(B). Then, the electrical signal from the image pickup device 110 is transformed by the A/D converter 227 into a two-dimensional formation (digital signal), and the image processor 228 provides a processing window EW2c by which the picture element integration is carried out in the Y-axis direction in FIG. 30 whereby a one-dimensional formation (FIG. 30(E)) is obtained. Subsequently, the one-dimensional pattern matching operation is effected while taking the center of the picture plane as the origin, to measure a deviation Δ2c of the mark center from the center of the picture plane, and the measured deviation is memorized.

At step 4, the wafer stage 10 is moved through a predetermined distance (corresponding to the design positional difference between the alignment marks MW2 and MW3). Then, the He-Ne laser 22 is lighted and the image of the alignment mark MW3 is formed on the image pickup device 110, along the path as described. The formed image is such as shown in FIG. 30(C). Then, the electrical signal from the image pickup device 110 is transformed by the A/D converter 227 into a two-dimensional formation (digital signal), and the image processor 228 provides a processing window EW3c by which the picture element integration is carried out in the Y-axis direction in FIG. 30 whereby a one-dimensional formation (FIG. 30(F)) is obtained. Subsequently, the one-dimensional pattern matching operation is effected while taking the center of the picture plane as the origin, to measure a deviation Δ3c of the mark center from the center of the picture plane, and the measured deviation is memorized.

Figure 31:
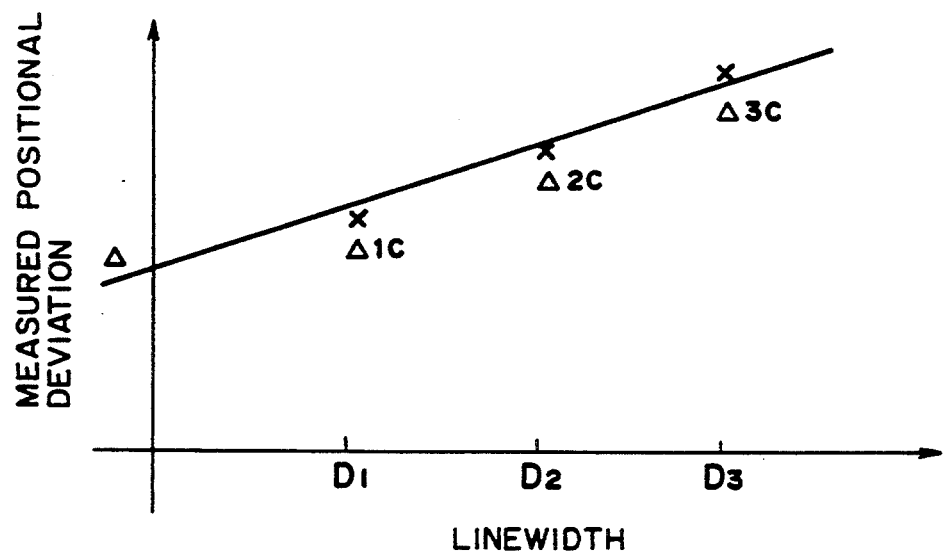
FIG. 31 is a schematic view for explaining the correction of misestimation in detecting the center position of the wafer mark.

At step 5, from the deviations Δ1c, Δ2c and Δ3c, a small deviation (error) attributable to non-uniformness of resist coating, is calculated. FIG. 31 shows the relationship of the deviations with the linewidth. In FIG. 31, each reference x denotes a measured quantity. On the basis of an equation on the relationship of the measured quantity, the deviation of the wafer mark MW and the linewidth (in this embodiment, as a linear approximation, a linear equation is used as the relational equation) and according to the least square method, the real quantity Δ of positional deviation in the state in which the alignment mark has a zero linewidth is determined. In other words, the real position of the wafer mark MW relative to the position of the image pickup device 110 is determined.

At step 5, the real positional deviation of the wafer W and the alignment device is converted into the coordinate with respect to the reticle R, and by using the alignment control device 229, the wafer stage 10 is driven to bring the wafer to a predetermined site for the exposure operation. By this, the alignment operation is accomplished.

In the present embodiment, by using the wafer marks MW having different linewidths, measurements are effected at different times. However, as an example, the alignment marks may be separated into two groups such that the alignment marks MW1 and MW2 are measured simultaneously while the alignment mark MW3 is measured at a different time.

It is to be noted here that the present invention is applicable also to alignment systems such as follows.

(a) An alignment system wherein Fresnel zone plates comprising patterns of different linewidths are used and wherein each zone plate is imaged or, by using the zone plate, a light spot is formed.

(b) An alignment system wherein a laser beam is scanningly deflected or a wafer is moved such that the wafer is scanned with the laser beam, and wherein an image of a wafer mark or a light signal from the wafer is detected in an electrical signal and with time.

(c) An alignment system wherein, in the second embodiment, the dark-field method is used in place of the bright-field method.

Next, another aspect of the present invention will be described.

Since a resist of a wafer is applied in accordance with a spin coating method, the state of resist coating changes in dependence upon the distance on the wafer from the center of the wafer. Namely, if the angular speed in the spin coating is denoted by the centrifugal force F with a radius r while taking the wafer center as an origin is given by:

$$F \propto r\omega^2$$

and it acts on the resist as an external force. This causes non-uniformness of resist coating in the radial direction. It is known that misestimation in the position detection attributable to such non-uniformness of coating is the function of the radius r ("1990, Autumn, The Society of Applied Physics, Abstract", 27p-ZG-16, Kazuhiro Yamashita et al). If the measured value of the position is f(r), then we obtain:

$$f(r) = m \times r + f0 \qquad (1)$$

wherein f0 is the inherent positional deviation of the wafer and m is called "wafer magnification", that is, the size of the wafer. The wafer magnification m depends on the non-uniformness of resist coating as suggested above and, thus, it depends on the linewidth w and we obtain:

$$m(w) = a \times w + m0 \qquad (2)$$

wherein m0 is the coefficient of actual wafer contraction caused by thermal effect or the like during the semiconductor device manufacturing processes, and it is called "real wafer magnification".

Figure 35:
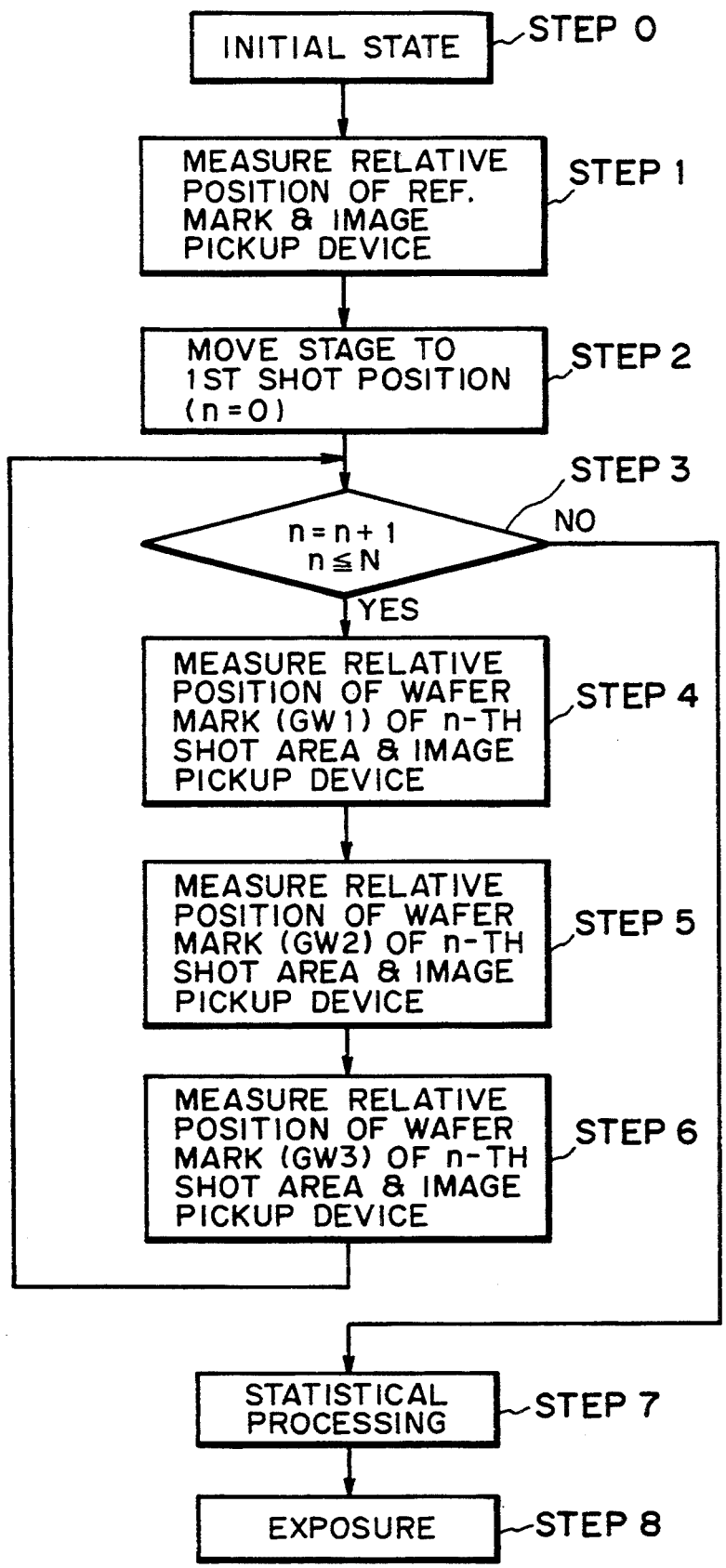
FIG. 35 is a flow chart, for explaining a further embodiment of the present invention.

Referring now to the flow chart of FIG. 35, an alignment method according to another embodiment of the present invention will be described. Also in this embodiment, the wafer alignment marks shown in FIG. 21 are used.

Figure 36A:
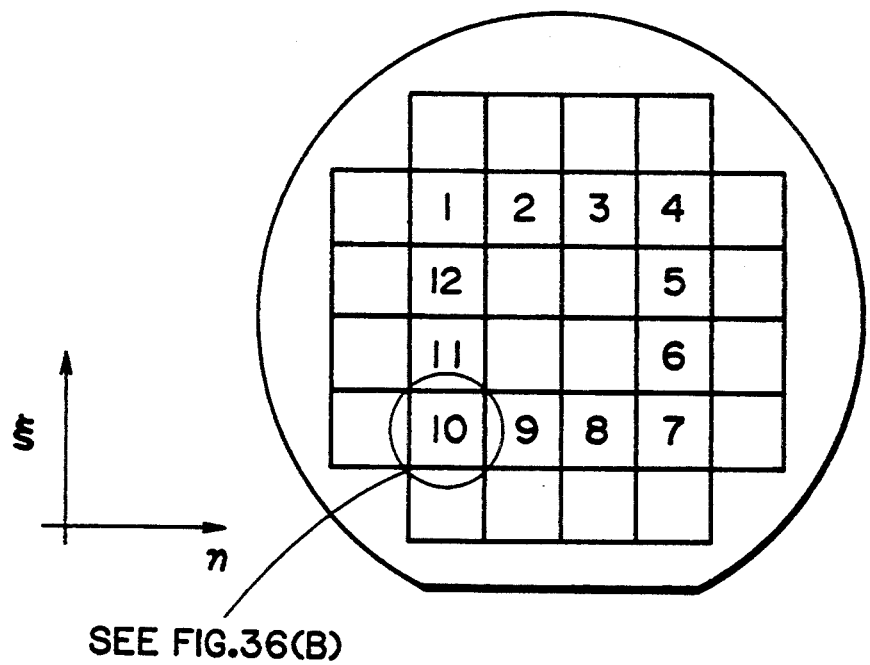
FIGS. 36(A-B) are schematic views for explaining a wafer mark provided in a shot area.
Figure 36B:
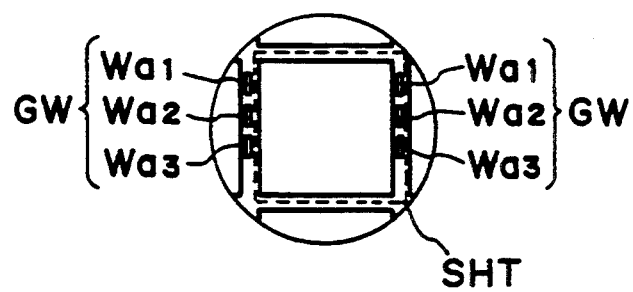

On a wafer W, there are a plurality of zones SHT, called "shot areas" (e.g. thirty-two shot areas), on which circuit patterns and wafer marks GS are provided as a result of exposure using the same reticle. FIGS. 36(A) and 36(B) show such shot areas on the wafer W in this embodiment and, for convenience, numbers are assigned to these shot areas.

In the initial state at step 0, the relative position of the reticle R and the alignment device (e.g. CCD 110) has already been adjusted (aligned), and the correspondence between the origin of coordinate on the reticle R and the center of the reference mark GS has already been assured.

At step 1, the LED light source 212 is lit and the image of the reference mark GS is formed on the image pickup device 110. The formed image is such as shown in part FIG. 16(B). Then, the electrical signal of the image pickup device 11 is transformed by an analog-to-digital converter (A/D converter) 27 into a two-dimensional formation. After this, an image processor 28 provides a processing window ES by which picture element integration is carried out in the Y-axis direction in FIG. 16(B), whereby an electrical signal of one-dimensional formation such as shown in FIG. 16(C) is obtained. Then, while taking the center of the picture plane as the origin, the FFT (fast Fourier transformation) operation is effected to measure a deviation ΔS from the center of the picture plane corresponding to the basic frequency and to determine the positional relationship between the image pickup device 11 and the reference mark GS which is fixed to the alignment device. In response, the illumination by the LED 212 is ceased.

At step 2, through the drive of the wafer stage 10, the wafer W has already been set at a predetermined site in the alignment device with a precision of microns order, to assure that when the wafer is illuminated by the He-Ne laser 22 the image of the wafer mark GW is picked up by the image pickup device 110.

At step 3, a discrimination is made to confirm that the current shot number n is not equal to N (e.g. 12). If the shot number is equal to N, the sequence goes to step 7.

Figure 37A:
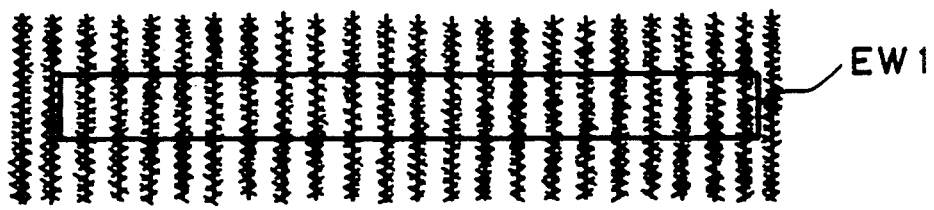
FIGS. 37(A)-(C) are schematic views of an image of the wafer mark of FIG. 36.

At step 4, if the shot number n is not equal to 1, then the wafer stage 10 is moved through a predetermined distance (corresponding to the design positional difference between the alignment mark Wa3 of the shot area of the number n-1 and the alignment mark Wa1 of the shot area of the number n), and the stopper controller 30 operates to adjust the stopper 225 to change the light transmitting portion to the one 25a shown in FIG. 24(A). Then, the He-Ne laser 22 is lighted and the image of the alignment mark Wa1 of the shot area of the number n is formed on the image pickup device 110, along the path as described. The formed image is such as shown in FIG. 37(A).

Then, the electrical signal from the image pickup device 110 is transformed by the A/D converter 227 into a two-dimensional formation (digital signal), and the image processor 228 provides a processing window EW1 by which the picture element integration is carried out in the Y-axis direction in FIG. 37 whereby a one-dimensional formation is obtained. Subsequently, the FFT (fast Fourier transformation) operation is effected while taking the center of the picture plane as the origin, to measure a deviation Δ1n from the center of the picture plane corresponding to the basic frequency, and the measured deviation is memorized.

Figure 37B:
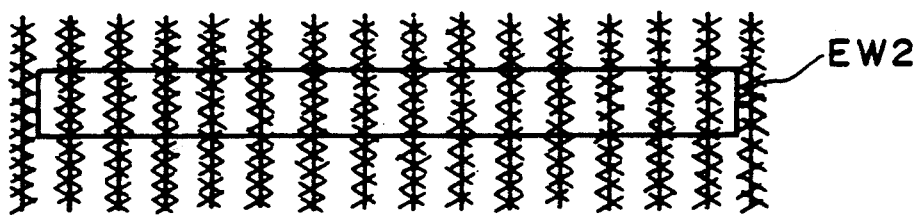

At step 5, the wafer stage 10 is moved through a predetermined distance (corresponding to the design positional difference between the alignment marks Wa1 and Wa2), and the stopper controller 30 operates to adjust the stopper 225 so that the stopper 25b shown in FIG. 24(B) is positioned on the light path. Then, the He-Ne laser 22 is lit and the image of the alignment mark Wa2 is formed on the image pickup device 110, along the path as described. The formed image is such as shown in FIG. 37(B). Then, the electrical signal from the image pickup device 110 is transformed by the A/D converter 227 into a two-dimensional formation (digital signal), and the image processor 228 provides a processing window EW2 by which the picture element integration is carried out in the Y-axis direction in FIG. 37 whereby a one-dimensional formation is obtained. Subsequently, the FFT (fast Fourier transformation) operation is effected while taking the center of the picture plane as the origin, to measure a deviation Δ2n from the center of the picture plane corresponding to the basic frequency, and the measured deviation is memorized.

Figure 37C:
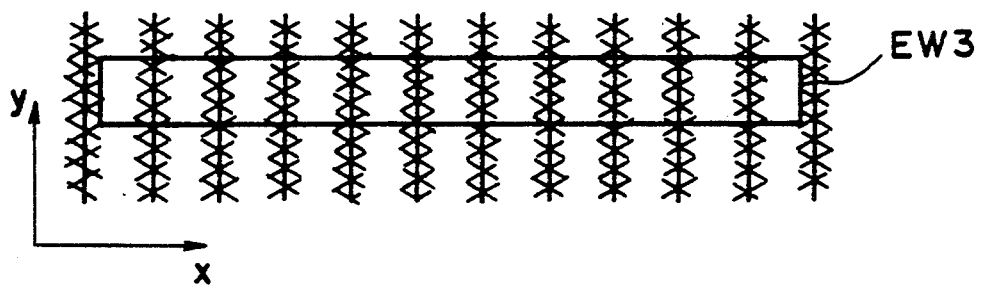

At step 6, the wafer stage 10 is moved through a predetermined distance (corresponding to the design positional difference between the alignment marks Wa2 and Wa3), and the stopper controller 30 operates to adjust the stopper 225 so that the stopper 25c shown in FIG. 24(C) is positioned on the light path. Then, the He-Ne laser 22 is lit and the image of the alignment mark Wa3 is formed on the image pickup device 110, along the path as described. The formed image is such as shown in FIG. 37(C). Then, the electrical signal from the image pickup device 110 is transformed by the A/D converter 227 into a two-dimensional formation (digital signal), and the image processor 228 provides a processing window EW3 by which the picture element integration is carried out in the Y-axis direction in FIG. 37 whereby a one-dimensional formation is obtained. Subsequently, the FFT (fast Fourier transformation) operation is effected while taking the center of the picture plane as the origin, to measure a deviation Δ3n from the center of the picture plane corresponding to the basic frequency, and the measured deviation is memorized.

Figure 38:
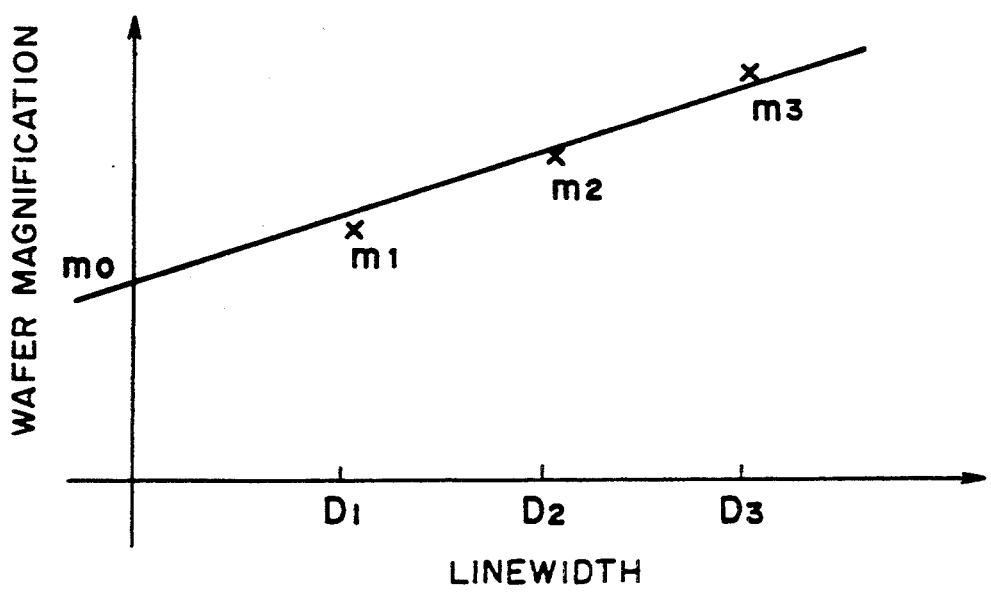
FIG. 38 is a schematic view for explaining the correction of misestimation in detecting a wafer magnification, in accordance with the method shown in FIG. 35.
Figure 39:
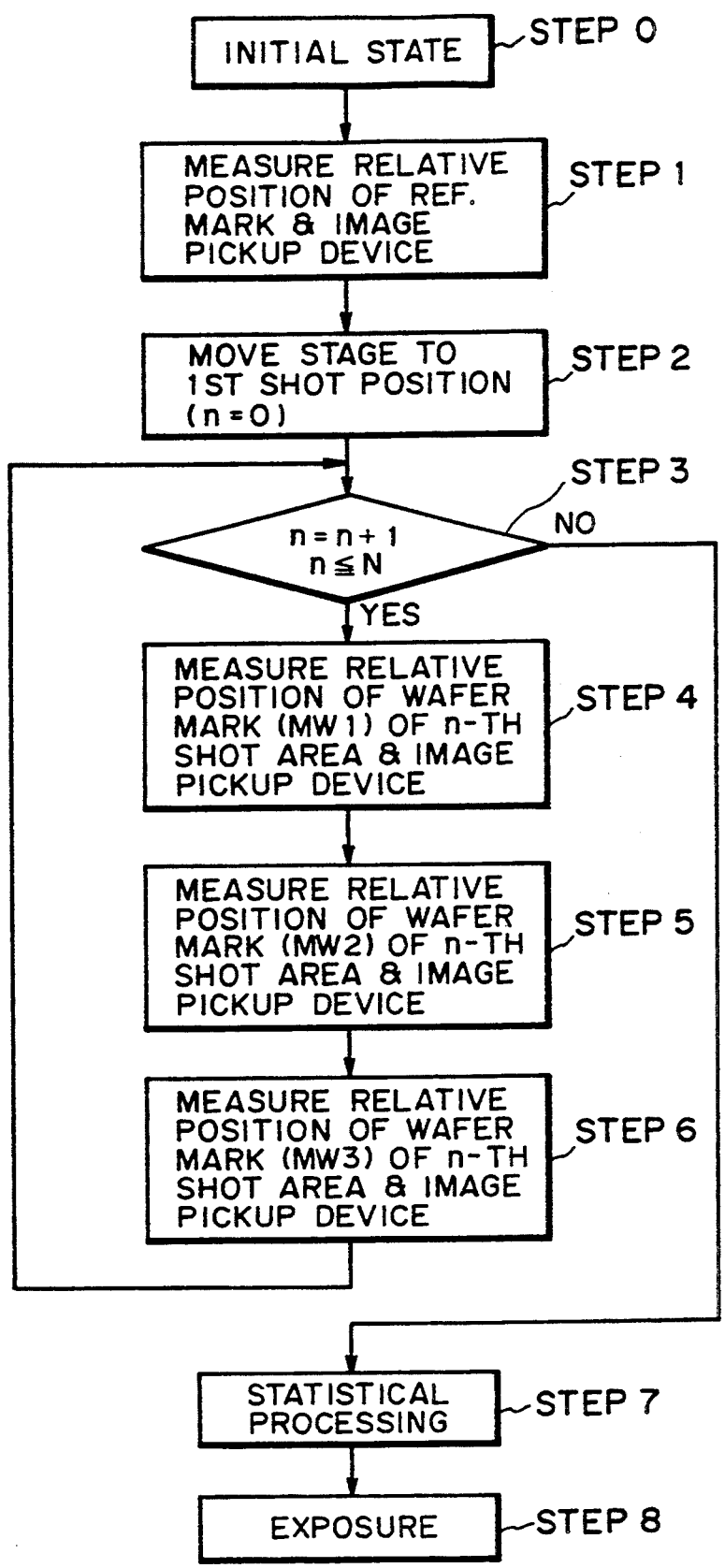
FIG. 39 is a flow chart for explaining a further embodiment of the present invention.

At step 7, from the deviations Δ1n, Δ2n and Δ3n as measured with respect to each shot area as well as the positions of the alignment marks, and by using the deviations of a set of alignment marks having the same linewidth, the wafer magnification of each shot area is calculated. Here, since the alignment marks Wa1–Wa3 of the wafer mark GW are juxtaposed along the ξ direction such as shown in FIG. 36, calculation is made while replacing the radius r in equation (1) by the projection component to the ξ axis. Then, from the linewidth and the wafer magnification, the misestimation of the wafer magnification attributable to the non-uniformness of resist coating is calculated. FIG. 38 shows the relationship of the wafer magnifications m1, m2 and m3 with the linewidths of the alignment marks Wa1, Wa2 and Wa3.

In FIG. 38, each reference x denotes a measured quantity. On the basis of an equation on the relationship of the measured quantity, the deviation and the linewidth (in this embodiment, as a linear approximation, a linear equation is used as the relational equation) and according to the least square method, the real wafer magnification m0 in the state in which the alignment mark Wa has a zero linewidth is determined.

At step 8, by using the positional information about the mars of each shot area and the quantity of real wafer magnification, the alignment controller 29 operates to calculate the target position of each shot area to be assumed during the exposure operation and to move the wafer stage ST to the target position, in the exposure operation of that shot area. By this, the alignment operation is accomplished.

In the present embodiment, by using the alignment marks Wa1–Wa3 having different linewidths, measurements are effected at different times. However, as an example, the alignment marks may be separated into two groups such that the alignment marks Wa1 and Wa2 are measured simultaneously while the alignment mark Wa3 is measured at a different time. Alternatively, the alignment marks may be so formed that they are observed simultaneously.

In this embodiment, the misestimation of wafer magnification largely depends on the semiconductor device manufacturing process and, for those wafers having treated by the same process, they have no significant difference. Therefore, it is a possible alternative that: the detection of the wafer magnification is effected only to the first wafer, of the wafers treated by the same process, and after determining the difference $\Delta m$ between the real wafer magnification and the calculated value mc1 of wafer magnification related to the alignment mark Wa1, it is memorized; for the remaining wafers, the quantity of misestimation of the wafer magnification related to the alignment mark Wa1 is not changed but retained, and in this state the measurement of deviation between shots is effected only to the alignment mark Wa1 of the wafer; and the calculated wafer magnification is corrected with $\Delta m$ and the positional deviations of all the shot areas of the wafer are predicted.

Further, in this embodiment, the alignment marks are different both in the pitch LW and in the linewidth D. But, as the alignment marks Wb1–Wb3 shown in FIG. 32, the alignment marks may have the same pitch LW and different linewidths D.

Figure 43:
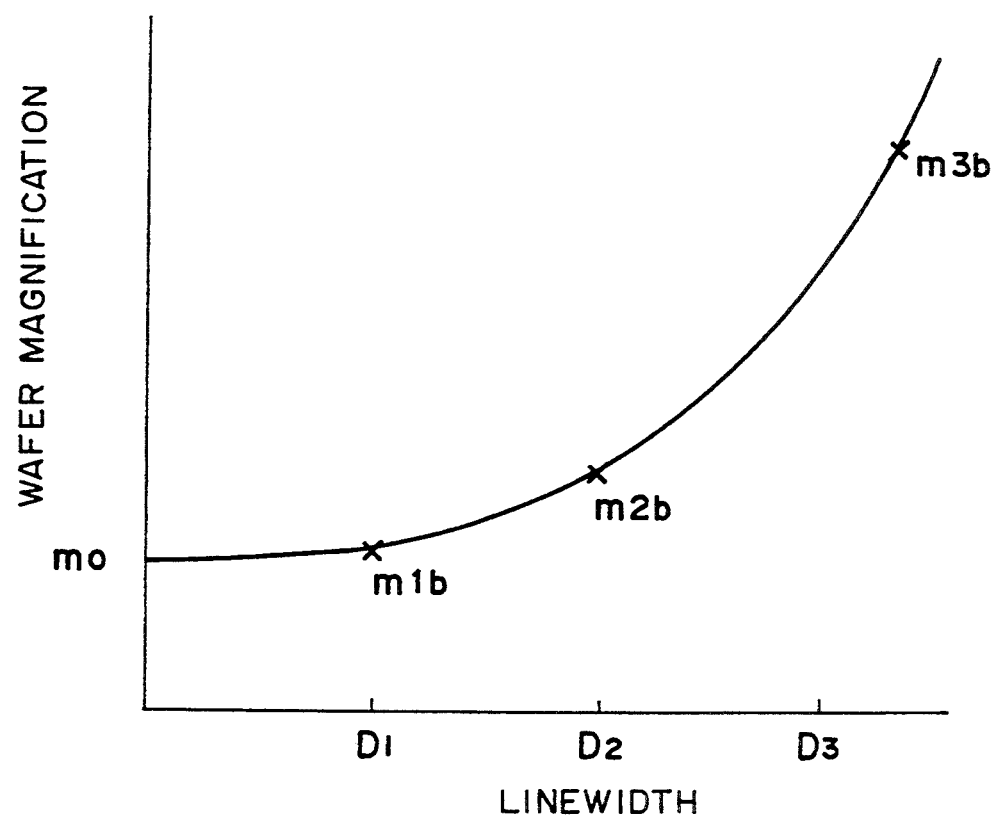
FIG. 43 is a schematic view for explaining the correction of misestimation in detecting the wafer magnification, in accordance with another method.

In that case, since the alignment marks has the same pitch LW as the diffraction grating, the stopper controller 30 shown in FIG. 20 is unnecessary. As regards the stopper 225, only the stopper having a pair of light transmitting areas 25a shown in part (A) of FIG. 24 may be used. Here, the relationship between the linewidth and the wafer magnifications m1b, m2b and m3b is in conformity with a quadratic function such as shown in FIG. 43, for example. Thus, in this case, by using the measured quantities m1b, m2b and m3b as well as the data of the linewidths D1, D2 and D3, the coefficient of the quadratic function is determined in accordance with the least square method and, from this quadratic function, the limit of the linewidth $D=0$ is detected as the real wafer magnification.

Where the same linewidth but different pitches LW are used such as shown in FIGS. 34(B) and 34(C) the sectional shapes of the marks (FIGS. 34(B) and 34(C)) are like the case where the linewidth is in effect changed. For this reason, it is possible to attain substantially the same advantageous effects as described hereinbefore.

In this embodiment, in each shot area, the alignment marks Wa1–Wa3 of the wafer mark GW are measured sequentially and, thereafter, the next wafer mark is measured. However, it is a possible alternative that measurement is effected to the alignment marks Wa1 of all the shot areas and then to the alignment marks Wa2 of these shot areas and finally to the alignment mark Wa3 of the shot areas, and subsequently, the wafer magnifications are calculated in accordance with statistical processing.

FIGS. 40(A), 40(B), 41(A)–41(F), and 42 are schematic views for explaining a further embodiment of the present invention. In this embodiment, the arrangement shown in FIG. 26 and the wafer mark shown in FIG. 27 are used to execute the sequence of FIG. 35.

Referring to FIGS. 40(A), 40(C), 41(A)–41(F), and 42 as well as 26–28 and 35, the alignment method according to this embodiment will be explained.

Figure 40A:
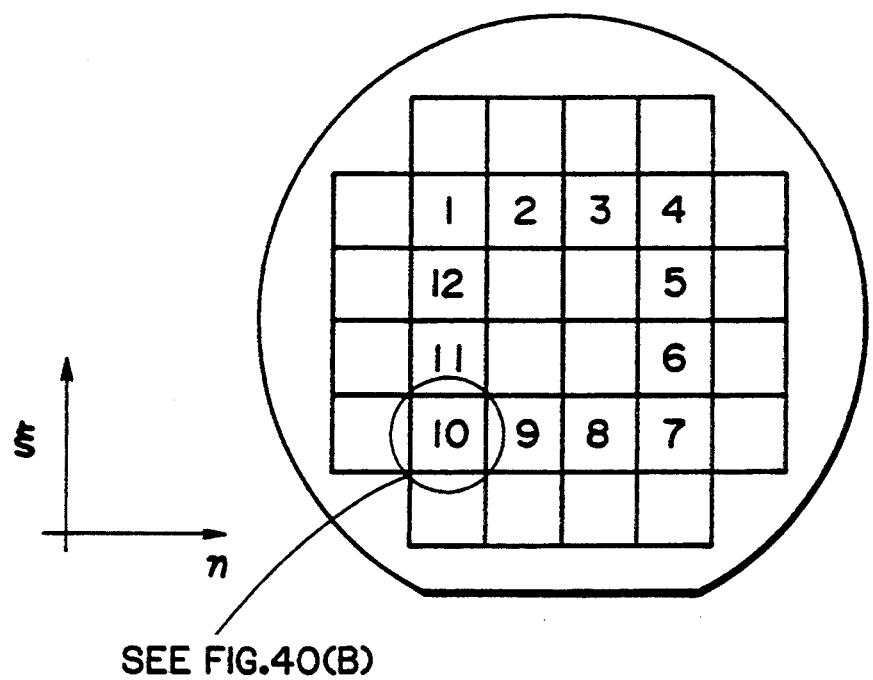
FIG. 40 is a schematic view of a wafer mark provided in a shot area.
Figure 40B:
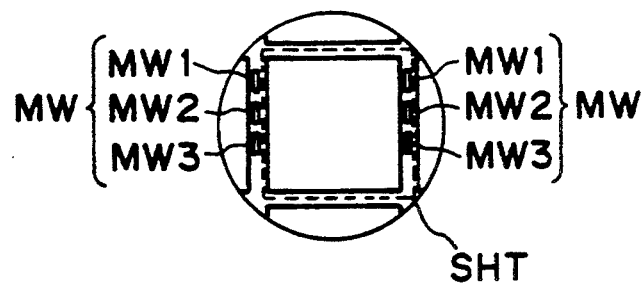

On a wafer W, there are a plurality of zones SHT, called "shot areas" (e.g. thirty-two shot areas), on which circuit patterns and wafer marks GS are provided as a result of exposure using the same reticle. FIG. 40(A) and 40(B) show such shot areas on the wafer W in this embodiment and, for convenience, numbers are assigned to these shot areas.

In the initial state at step 0, the relative position of the reticle R and the alignment device (e.g. CCD 110) has already been adjusted (aligned), and the correspondence between the origin of coordinate on the reticle R and the center of the reference mark GS has already been assured.

At step 1, the LED light source 212 is lit and the image of the reference mark MS is formed on the image pickup device 110. The formed image is such as shown in FIG. 28(B). Then, the electrical signal of the image pickup device 11 is transformed by an analog-to-digital converter (A/D converter) 27 into a two-dimensional formation. After this, an image processor 28 provides a processing window ES2 by which picture element integration is carried out in the Y-axis direction in FIG. 28(B), whereby electrical signal of one-dimensional formation such as shown in FIG. 28(C) is obtained. Then, while taking the center of the picture plane as the origin, the one-dimensional pattern matching operation is effected to measure a deviation $\Delta S$ of the center of the reference mark MS from the center of the picture plane and to determine the positional relationship between the image pickup device 110 and the reference mark MS which is fixed to the alignment device. In response, the illumination by the LED 212 is ceased.

At step 2, through the drive of the wafer stage 10, the wafer W has already been set at a predetermined site in the alignment device with a precision of microns order, to assure that when the wafer is illuminated by the He-Ne laser 22 the image of the wafer mark GW is picked up by the image pickup device 110.

At step 3, a discrimination is made to confirm that the current shot number n is not equal to N (e.g. 13). If the shot number is equal to N, the sequence goes to step 7.

At step 4, if the shot number n is not equal to 1, then the wafer stage 10 is moved through a predetermined distance (corresponding to the design positional difference between the alignment mark MW3 of the shot area of the number n-1 and the alignment mark MW1 of the shot area of the number n).

Then, the He-Ne laser 22 is lit and the image of the alignment mark MW1 of the shot area of the number n is formed on the image pickup device 110, along the path as described. The formed image is such as shown in FIG. 4(A). Then, the electrical signal from the image pickup device 110 is transformed by the A/D converter 227 into a two-dimensional formation (digital signal), and the image processor 228 provides a processing window EW1c by which the picture element integration is carried out in the Y-axis direction in FIG. 41 whereby a one-dimensional formation (FIG. 41 D)) is obtained. Subsequently, the one-dimensional pattern matching operation is effected while taking the center of the picture plane as the origin, to measure a deviation $\Delta 1c$ of the mark center from the center of the picture plane, and the measured deviation is memorized.

At step 5, the wafer stage 10 is moved through a predetermined distance (corresponding to the design positional difference between the alignment marks MW1 and MW2). Then, the He-Ne laser 22 is lit and the image of the alignment mark MW2 of the shot area n is formed on the image pickup device 110, along the path as described. The formed image is such as shown in FIG. 41(B). Then, the electrical signal from the image pickup device 110 is transformed by the A/D converter 227 into a two-dimensional formation (digital signal), and the image processor 228 provides a processing window EW2c by which the picture element integration is carried out in the Y-axis direction in FIG. 41 whereby a one-dimensional formation (FIG. 41(E)) is obtained. Subsequently, the one-dimensional pattern matching operation is effected while taking the center of the picture plane as the origin, to measure a deviation $\Delta 2c$ of the mark center from the center of the picture plane, and the measured deviation is memorized.

At step 6, the wafer stage 10 is moved through a predetermined distance (corresponding to the design positional difference between the alignment marks MW2 and MW3). Then, the He-Ne laser 22 is lighted and the image of the alignment mark MW3 is formed on the image pickup device 110, along the path as described. The formed image is such as shown in FIG. 41(C). Then, the electrical signal from the image pickup device 110 is transformed by the A/D converter 227 into a two-dimensional formation (digital signal), and the image processor 228 provides a processing window EW3c by which the picture element integration is carried out in the Y-axis direction in FIG. 41 whereby a one-dimensional formation (FIG. 41(F)) is obtained. Subsequently, the one-dimensional pattern matching operation is effected while taking the center of the picture plane as the origin, to measure a deviation $\Delta 3c$ of the mark center from the center of the picture plane, and the measured deviation is memorized.

At step 7, from the deviations $\Delta 1c - \Delta 3c$ as well as the positions of the alignment marks MW, the wafer magnifications m1c, m2c and m3c under respective linewidths, are calculated. From the linewidth and the wafer magnification, the misestimation of wafer magnification attributable to the non-uniformness of resist coating is calculated. The relationship of between the linewidth D (D1, D2, D3) of the alignment marks MW1, MW2 and MW3 and the wafer magnifications m1c, m2c and m3c, is such as shown in FIG. 38.

In FIG. 38, each reference x denotes a measured quantity. On the basis of an equation on the relationship of the measured quantity, the deviation and the linewidth (in this embodiment, as a linear approximation, a linear equation is used as the relational equation) and according to the least square method, the real wafer magnification m0 in the state in which the alignment mark Wa has a zero linewidth is determined.

At step 8, by using the positional information about the mars of each shot area and the quantity of real wafer magnification, the alignment controller 29 operates to calculate the target position of each shot area to be assumed during the exposure operation and to move the wafer stage ST to the target position, in the exposure operation of that shot area. By this, the alignment operation is accomplished.

In the present embodiment, by using the alignment marks MW1–MW3 having different linewidths, measurements are effected at different times. However, as an example, the alignment marks may be separated into two groups such that the alignment marks MW1 and MW2 are measured simultaneously while the alignment mark MW3 is measured at different time. Alternatively, the alignment marks may be so formed that they are observed simultaneously.

In this embodiment, the misestimation of wafer magnification largely depends on the semiconductor device manufacturing process and, for those wafers having treated by the same process, they have no significant difference. Therefore, it is a possible alternative that: the detection of the wafer magnification is effected only to the first wafer, of the wafers treated by the same process, and after determining the difference $\Delta m$ between the real wafer magnification m0 and the calculated value mc1 of wafer magnification related to the alignment mark MW1, it is memorized; for the remaining wafers, the quantity of misestimation of the wafer magnification related to the alignment mark MW1 is not changed but retained, and in this state the measurement of deviation between shots is effected only to the alignment mark MW1 of the wafer; and the calculated wafer magnification is corrected with $\Delta m$ and the positional deviations of all the shot areas of the wafer are predicted.

In accordance with these embodiments of the present invention, it is possible to calculate the misestimation of wafer magnification attributable to non-uniformness of resist coating, from the linewidth of the alignment mark and the measured quantity of the position, and it is possible to avoid an error component due to the non-uniformness of resist coating.

The concept of these embodiments related to the wafer magnification can be applied to other types of alignment systems such as:

(a) an alignment system using an alignment mark provided by a Fresnel zone plate;

(b) an alignment system wherein a laser beam is scanningly deflected or a wafer is moved such that the wafer is scanned with the laser beam, and wherein an image of a wafer mark or a light signal from the wafer is detected in an electrical signal and with time; and (c) an alignment system wherein a wafer mark is observed in a dark field.

While the invention has been described with reference to the structures disclosed herein, it is not confined to the details set forth and this application is intended to cover such modifications or changes as may come within the purposes of the improvements or the scope of the following claims.

I claim:

1. A method of detecting a position of a substrate with respect to a particular direction, wherein the substrate has first and second patterns of different sizes in the particular direction and has a surface layer formed thereon, said method comprising the steps of:
   detecting the first and second patterns to produce first and second data related to the position of the substrate;
   predicting, by using the first and second data and the sizes of the first and second patterns in the particular direction, the position of the substrate as determined when the pattern size in the particular direction is smaller than the actual size of the patterns; and
   adjusting the position of the substrate on the basis of said prediction.

2. A method according to claim 1, wherein said predicating step includes determining a function $x=x(w)$ wherein w is the size and x is the quantity of data, by using the first and second data and the sizes of the first and second patterns in the particular direction, and determining a data $x(0)$ related to the position of the substrate, by using the function.

3. A semiconductor device manufacturing method comprising the steps of:
   adjusting the position, in a particular direction, of a wafer having first and second patterns of different sizes in the particular direction and a resist layer formed thereon; and
   printing a circuit pattern on the resist layer,
   wherein said adjusting step comprises the steps of:
      detecting the first and second patterns to produce first and second data related to the position of the wafer;
      predicting, by using the first and second data and the sizes of the first and second patterns in the particular direction, the position of the wafer as determined when the pattern size in the particular direction is smaller than the actual size of the patterns; and
      adjusting the position of the wafer on the basis of said prediction.

4. A method according to claim 3, wherein said predicating step includes determining a function $x=x(w)$ wherein w is the size and x is the quantity of data, by using the first and second data and the sizes of the first and second patterns in the particular direction, and determining a data $x(0)$ related to the position of the wafer, by using the function.

5. An exposure apparatus for exposing a wafer having first and second patterns of different sizes in a particular direction and having a resist layer formed thereon, said apparatus comprising:
   a movable stage for supporting the wafer;
   exposing means for irradiating the resist of the wafer with a radiation beam in response to alignment of the wafer with respect to a predetermined position, to print a circuit pattern on the resist of the wafer;
   a detection optical system for photoelectrically detecting the first and second patterns to produce first and second signals related to them; and
   control means having a signal processing device for producing, by using the first and second signals and the sizes of the first and second patterns in the particular direction, data related to the position of the wafer as determined when the pattern size in the particular direction is smaller than the actual size of the patterns, said control means controlling movement of said movable stage on the basis of the data to complete the alignment of the wafer.

6. An apparatus according to claim 5, wherein said signal processing device determines a function $x=x(w)$ wherein w is the size and x is the quantity of data, by using the first and second signals and the sizes of the first and second patterns in the particular direction and, by using the function, it determines a data $x(0)$, as said produced data.

7. A method of detecting distortion of a wafer wherein the wafer has first and second zones each having first and second patterns which are different in size with respect to a predetermined direction and wherein the wafer is coated with a resist, said method comprising the steps of:
   detecting the first and second patterns of each of the first and second zones;
   producing first data related to the distortion of the wafer by using positional information related to the first pattern of each of the first and second zones, and producing second data related to the distortion of the wafer by using positional information related to the second pattern of each of the first and second zones; and
   determining third data related to the distortion of the wafer, where the size of each of the first and second pattern in the predetermined direction is smaller than the actual size of the patterns, by using the size of each of the first and second patterns in the predetermined direction as well as the first and second data.

8. A method according to claim 7, wherein said determining step includes (i) determining a function $m=m(w)$ related to the size w and the value m of the data, by using the size of each of the first and second patterns in the predetermined direction and the first and second data, and (ii) determining the data $m(0)$ related to the distortion of the wafer by using the determined function.

9. A method of detecting the position of a mark of a substrate with respect to a predetermined direction, wherein the mark has first and second patterns which are different in size with respect to the predetermined direction and wherein a thin film is formed on the substrate, said method comprising the steps of:
   detecting the first and second patterns to produce first and second data related to the position of the mark; and
   determining data related to the position of the mark, wherein the size of each of the first and second patterns in the predetermined direction is smaller than the actual size of the patterns, by using the size of each of the first and second patterns in the predetermined direction as well as the first and second data.

10. A method according to claim 9, wherein said determining step includes (i) determining a function $x=x(w)$ related to the size w and the value x of the data, by using the size of each of the first and second patterns in the predetermined direction and the first and second data, and (ii) determining the data $x(0)$ related to the position of the mark by using the determined function.

* * * * *

UNITED STATES PATENT AND TRADEMARK OFFICE
CERTIFICATE OF CORRECTION

PATENT NO. : 5,418,613     Page 1 of 3
DATED : May 23, 1995
INVENTOR(S) : SHIGEKI MATSUTANI It is certified that error appears in the above-indentified patent and that said Letters Patent is hereby corrected as shown below:

ON THE COVER PAGE

At [57] ABSTRACT
    Line 1 of the Abstract, "a position" should read --the position--, and "the substrate" should read --a substrate--.

Sheet 3 OF THE DRAWINGS
    In Figure 3, in box 113, "CORRECTNG" should read --CORRECTING-- .

Column 2
    Line 16, "a position" should read --the position--, and "the substrate" should read --a substrate--.

Column 4
    Line 50, "FIG. 40 is" should read --FIGS. 40(A) and 40(B) are--, and "view" should read --views--.

Column 10
    Line 46, "FIG. 16(B)." should read --FIG. 16(A).--.

Column 12
    Line 7, "part (A) of FIG. 21," should read --FIG. 21(A),--.
    Line 11, "21(B) FIG. 21," should read --FIG. 21(B),--.
    Line 23, "pitich" should read --pitch--.
    Line 59, "travel" should read --travels--.
    Line 65, "travel" should read --travels--.

Column 13
    Line 4, "travel" should read --travels--.

UNITED STATES PATENT AND TRADEMARK OFFICE
CERTIFICATE OF CORRECTION

PATENT NO. : 5,418,613
DATED : May 23, 1995
INVENTOR(S) : SHIGEKI MATSUTANI

It is certified that error appears in the above-indentified patent and that said Letters Patent is hereby corrected as shown below:

Column 14
    Line 5, "FIG. 16," should read --FIG. 16(B),--.
    Line 6, "part (B)," should be deleted.
    Line 7, "FIG. 16(B)" should read --FIG. 16(C)--.
    Line 39, "lighted" should read --lit--.

Column 15
    Line 44, "ares" should read --areas--.
    Line 55, "34," should be deleted.

Column 19
    Line 68, "lighted" should read --lit--.

Column 22
    Line 5, "34(B)" should read --34(A)--.
    Line 26, "40(C)," should read --40(B),--.

UNITED STATES PATENT AND TRADEMARK OFFICE
CERTIFICATE OF CORRECTION

PATENT NO. : 5,418,613 Page 3 of 3
DATED : May 23, 1995
INVENTOR(S) : SHIGEKI MATSUTANI It is certified that error appears in the above-indentified patent and that said Letters Patent is hereby corrected as shown below:

Column 23
Line 14, "FIG. 4(A)." should read --FIG. 41(A).--.

Column 24
Line 15, "mars" should read --marks--.
Line 28, "at" should read --at a--.

Column 25
Line 25, "cating" should read --cting--.
Line 50, "cating" should read --cting--.

Signed and Sealed this

Seventeenth Day of October, 1995

Attest:

BRUCE LEHMAN

Attesting Officer

Commissioner of Patents and Trademarks